US011706954B2

(12) United States Patent
Kim et al.

(10) Patent No.: US 11,706,954 B2
(45) Date of Patent: Jul. 18, 2023

(54) DISPLAY DEVICE

(71) Applicant: Samsung Display Co., Ltd., Yongin-si (KR)

(72) Inventors: Myeong Ho Kim, Hwaseong-si (KR); Jay Bum Kim, Yongin-si (KR); Kyoung Seok Son, Seoul (KR); Sun Hee Lee, Seoul (KR); Seung Jun Lee, Suwon-si (KR); Seung Hun Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 169 days.

(21) Appl. No.: 17/002,113

(22) Filed: Aug. 25, 2020

(65) Prior Publication Data

US 2021/0143239 A1    May 13, 2021

(30) Foreign Application Priority Data

Nov. 7, 2019    (KR) .................... 10-2019-0141587

(51) Int. Cl.
*H01L 27/32*    (2006.01)
*H10K 59/124*    (2023.01)
(Continued)

(52) U.S. Cl.
CPC ......... *H10K 59/124* (2023.02); *H10K 59/122* (2023.02); *H10K 59/126* (2023.02); *H10K 59/1201* (2023.02)

(58) Field of Classification Search
CPC ............ H01L 27/3258; H01L 27/3272; H01L 2227/323
(Continued)

(56) References Cited

U.S. PATENT DOCUMENTS

2015/0179810 A1* 6/2015 Yamazaki ........... H01L 29/7869
257/43
2015/0243687 A1* 8/2015 Lee ..................... H01L 27/1251
257/43
(Continued)

FOREIGN PATENT DOCUMENTS

KR    10-2007-0072207 A    7/2007
KR    10-2018-0025427 A    3/2018
KR    10-2019-0008350 A    1/2019

*Primary Examiner* — Dzung Tran
(74) *Attorney, Agent, or Firm* — Lewis Roca Rothgerber, Christie LLP

(57) ABSTRACT

A display device includes a substrate, a first semiconductor pattern on the substrate and including a semiconductor layer of a first transistor, a first gate insulator on the substrate, a first conductive layer on the first gate insulator and including a first gate electrode of the first transistor and a first electrode of the capacitor connected to the first gate electrode of the first transistor, a first interlayer dielectric on the first gate insulator, a second semiconductor pattern on the first interlayer dielectric and including a semiconductor layer of a second transistor and a second electrode of the capacitor, a second gate insulator on the first interlayer dielectric, a second conductive layer on the second gate insulator and including a gate electrode of the second transistor and a third semiconductor pattern between the second semiconductor pattern and any one of the first conductive layer and the second conductive layer.

9 Claims, 25 Drawing Sheets

(51) Int. Cl.
*H10K 59/122* (2023.01)
*H10K 59/126* (2023.01)
*H10K 59/12* (2023.01)

(58) Field of Classification Search
USPC .......................................................... 257/40
See application file for complete search history.

(56) References Cited

U.S. PATENT DOCUMENTS

| | | | |
|---|---|---|---|
| 2015/0318359 A1* | 11/2015 | Shimomura | H01B 1/08 |
| | | | 257/43 |
| 2016/0163745 A1* | 6/2016 | Choi | H01L 27/1225 |
| | | | 257/40 |
| 2016/0190346 A1* | 6/2016 | Kawata | H01J 37/3447 |
| | | | 257/43 |
| 2017/0338315 A1* | 11/2017 | Yamazaki | H01L 29/0692 |
| 2018/0061921 A1* | 3/2018 | Son | H01L 27/3258 |
| 2019/0006521 A1 | 1/2019 | Noh et al. | |
| 2019/0252478 A1* | 8/2019 | Son | H01L 27/3262 |

\* cited by examiner

Fig. 2
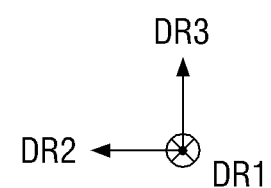

DISPLAY DEVICE

CROSS-REFERENCE TO RELATED APPLICATION

This application claims priority to and the benefit of Korean Patent Application No. 10-2019-0141587, filed on Nov. 7, 2019 in the Korean Intellectual Property Office (KIPO), the content of which is incorporated herein by reference in its entirety.

BACKGROUND

1. Field

One or more embodiments of the present disclosure relate to a display device.

2. Description of the Related Art

Along with the development of multimedia, display devices are increasing in importance. In response to this increase, several kinds of display devices such as a liquid crystal display (LCD) and an organic light emitting display (OLED) have been used. Among the display devices, OLEDs display images by using organic light emitting devices that generate light through the recombination of electrons and holes. OLEDs include a plurality of transistors that provide drive current to the organic light emitting devices.

SUMMARY

Aspects of example embodiments of the present disclosure are directed toward a display device having a reduced number of masks used during a manufacturing process.

Aspects of example embodiments of the present disclosure are directed toward a method of manufacturing a display device having a reduced number of masks used during a manufacturing process.

It should be noted that objects of the present disclosure are not limited to the above-described objects, and other objects of the present disclosure will be apparent to those skilled in the art from the following descriptions.

An embodiment of a display device including a first transistor and a second transistor having channels formed as different semiconductor layer and further including a capacitor, the display device includes a substrate, a first semiconductor pattern on the substrate and including the semiconductor layer of the first transistor, a first gate insulator on the substrate to cover the first semiconductor pattern, a first conductive layer on the first gate insulator and including a first gate electrode of the first transistor and a first electrode of the capacitor connected to the first gate electrode of the first transistor, a first interlayer dielectric on the first gate insulator to cover the first conductive layer, a second semiconductor pattern on the first interlayer dielectric and including the semiconductor layer of the second transistor and a second electrode of the capacitor, a second gate insulator on the first interlayer dielectric to cover an upper surface and a side surface of the second semiconductor pattern, a second conductive layer on the second gate insulator and including a gate electrode of the second transistor and a third semiconductor pattern between the second semiconductor pattern and any one of the first conductive layer and the second conductive layer and.

An embodiment of a display device including a first transistor, the first transistor includes a semiconductor layer of the first transistor formed as a first semiconductor pattern, a first gate electrode of the first transistor on the semiconductor layer of the first transistor and configured to form a first conductive layer, a second semiconductor pattern between the semiconductor layer of the first transistor and the first gate electrode of the first transistor, and a first insulating layer on the first semiconductor pattern and configured to cover an upper surface and a side surface of the first semiconductor pattern, wherein the second semiconductor pattern includes an oxide semiconductor.

An embodiment of a method of manufacturing a display device including a transistor, the method includes forming a first semiconductor pattern formed on a substrate as a first semiconductor layer, the first semiconductor pattern including a semiconductor layer of the transistor, forming a first conductive layer including a first gate electrode of the transistor on the first semiconductor pattern, forming a second semiconductor pattern between the first semiconductor pattern and the first conductive layer, and forming a first insulating layer on the first semiconductor layer to cover an upper surface and a side surface of the first semiconductor pattern, wherein the second semiconductor pattern overlaps the first gate electrode of the transistor, and the second semiconductor pattern includes an oxide semiconductor.

With the display device and the method of manufacturing the display device according to one or more example embodiments, the number of masks may be reduced, and thus it is possible to decrease processing costs and increase process efficiency.

The effects of the present disclosure are not limited to the above description, and various other effects are included in this specification.

BRIEF DESCRIPTION OF THE DRAWINGS

The above and other aspects and features of the present disclosure will become more apparent by describing exemplary embodiments thereof in detail with reference to the attached drawings, in which:

FIG. 2 is a side view of the display device of FIG. 1;

DETAILED DESCRIPTION

Figure 1:
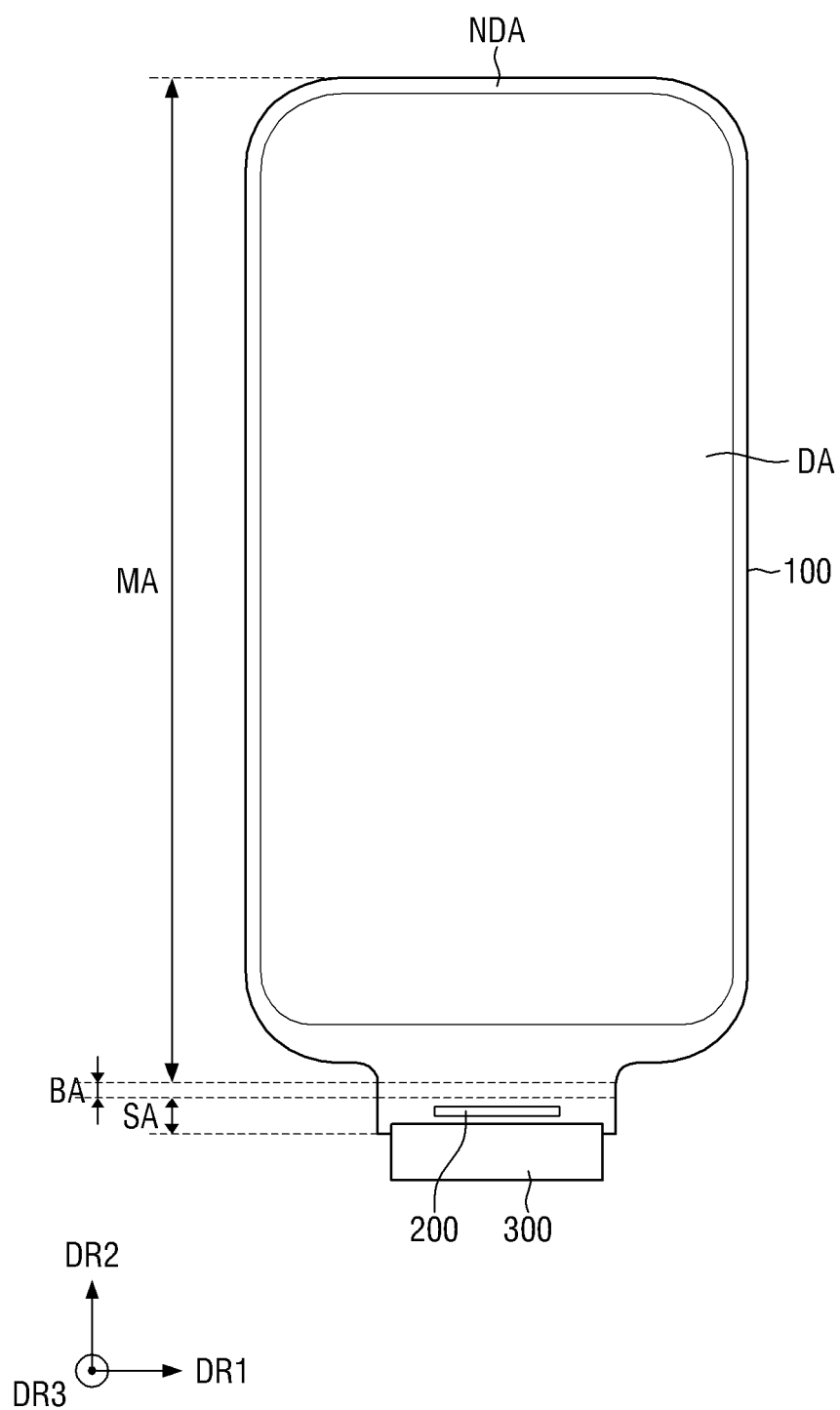
FIG. 1 is a plan view of a display device according to an embodiment.

The present invention will now be described more fully hereinafter with reference to the accompanying drawings, in which example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the term "and/or" includes any and all combinations of one or more of the associated listed items.

As used herein, expressions such as "at least one of", "one of", and "selected from", when preceding a list of elements, modify the entire list of elements and do not modify the individual elements of the list.

Further, the use of "may" when describing embodiments of the present disclosure refers to "one or more embodiments of the present disclosure".

As used herein, the phrase "a plan view" may refer to a view from top or from a direction normal to the display area of the display device.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features.

Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

It will also be understood that when a layer is referred to as being "on" another layer or substrate, the layer can be directly on the other layer or substrate, or intervening layers may also be present. The same reference numbers indicate the same components throughout the specification. In the attached drawings, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In concluding the detailed description, those skilled in the art will appreciate that many suitable variations and modifications can be made to the disclosed embodiments without substantially departing from the principles of the present invention. Therefore, the disclosed embodiments of the invention are used in a generic and descriptive sense only and not for purposes of limitation.

Hereinafter, embodiments will be described with reference to the accompanying drawings.

FIG. 1 is a plan view of a display device according to an embodiment. FIG. 2 is a side view of the display device of FIG. 1. FIG. 2 shows a side shape of the display device bent in the thickness direction.

A display device 1 is a device for displaying a video or a still image. The display device 1 may be used as a display screen for various kinds of products such as a television, a notebook computer, a monitor, a billboard, and an Internet of Things device, as well as portable electronic devices such as a mobile phone, a smartphone, a tablet personal computer (PC), a smart watch, a watch phone, a mobile communication terminal, an electronic notebook, an e-book reader, a portable multimedia player (PMP), a navigation device, and an ultra-mobile PC (UMPC).

The display device 1 according to one or more embodiments may have a substantially rectangular shape when viewed from the top (e.g., viewed from a direction normal to the display area). The display device 1 may have a rectangular shape of which corners have right angles when viewed from the top. However, the present disclosure is not limited thereto. For example, the display device 1 may have a generally rectangular shape of which corners are rounded (e.g., as shown in FIG. 1) when viewed from the top.

In the drawing, a first direction DR1 indicates the lateral direction of the display device 1 when viewed from the top, and a second direction DR2 indicates the longitudinal direction of the display device 1 when viewed from the top. Also, a third direction DR3 indicates the thickness direction of the display device 1. The first direction DR1 and the second direction DR2 are perpendicular or normal to each other, and the third direction DR3 is perpendicular or normal to both of the first direction DR1 and the second direction DR2 by being perpendicular or normal to a plane formed by the first direction DR1 and the second direction DR2. However, the directions mentioned in the embodiment should be understood to refer to relative directions, and the embodiment is not limited to the mentioned directions.

In the present disclosure, the terms "thereabove," "upper surface," and "upper side" expressed based on the third direction DR3 refer to a side of a display surface with respect to a display panel 100, and the terms "therebelow," "lower surface," and "lower side" refer to a side opposite to the display surface with respect to the display panel 100, unless otherwise defined herein.

Referring to FIGS. 1 and 2, the display device 1 may include the display panel 100. The display panel 100 may be a flexible substrate including a flexible polymer material such as a polyimide. Thus, the display panel 100 may be curved, bent, folded, and/or rolled up.

The display panel 100 may be an organic light emitting display panel. In the following embodiments, an organic light emitting display panel is used as the display panel 100. However, the present disclosure is not limited thereto. For example, other types of display panels such as a liquid crystal display (LCD) panel, a quantum dot organic light emitting display (QD-OLED) panel, a quantum dot liquid crystal display (QD-LCD), a quantum nano light emitting display (nano-LED) panel, and a micro-LED may be used instead.

The display panel 100 may include a display area DA where a screen is displayed (e.g., a screen is configured to provide an image) and a non-display area NDA where a display is not realized (e.g., an image is not displayed). The display panel 100 may be divided into the display area DA and the non-display area NDA when viewed from the top. The non-display area NDA may be placed to surround the display area DA. The non-display area NDA may form a bezel.

The display area DA may have a rectangular shape of which corners have right angles or have a rectangular shape of which corners are rounded when viewed from the top. The display area DA may have a long side and a short side. The short side of the display area DA may be a side extending in the first direction DR1. The long side of the display area DA may be a side extending in the second direction DR2. However, the planar shape of the display area DA is not limited to a rectangle and may have various suitable shapes such as a circle or an ellipse. In one or more embodiments, the display panel 100 may include a plurality of display areas spaced apart from each other.

The display area DA may include a plurality of pixels. The pixels may be arranged in the shape of a matrix. Each pixel may include an emission layer and a circuit layer for controlling a light-emission amount of the emission layer. The circuit layer may include a wiring, an electrode, and at least one transistor. The emission layer may contain an organic light emitting material. The emission layer may be sealed by an encapsulation film. A detailed configuration of the pixel may be described in more detail below.

The non-display area NDA may be disposed adjacent to both short sides and both long sides of the display area DA. In this case, the non-display area NDA may surround all sides of the display area DA and form the border of the display area DA. However, the present disclosure is not limited thereto. For example, the non-display area NDA may be disposed adjacent to both of the short sides or both of the long sides of the display area DA.

The display panel 100 may include a main area MA and a bending area connected to one side of the main area MA in the second direction DR2. The display panel 100 may further include a sub-area SA connected to one side of the bending area BA in the second direction DR2 and bent in the thickness direction to overlap the main area MA in the thickness direction. For example, at least a portion of the sub-area SA may overlap the main area MA when the bending area BA is bent in the thickness direction.

The display area DA may be placed in the main area MA. The non-display area NDA may be placed at a peripheral edge of the display area DA of the main area MA. In one or more embodiments, the non-display area NDA may be around the display area DA of the main area MA.

The main area MA may have a shape similar to a planar appearance (e.g., the main area MA may be flat) of the display device 1. The main area MA may be a flat area placed on one plane. However, the present disclosure is not limited thereto. For example, at least one of the edges of the main area MA except for an edge (side) connected to the bending area BA may be curved to form a curved surface or may be bent vertically.

When the at least one of the edges of the main area MA except for the edge (side) connected to the bending area BA forms a curved surface or is bent, the display area DA may be disposed even at the corresponding edge. However, the present disclosure is not limited thereto. For example, in one or more embodiments, the non-display area NDA where no screen is displayed may be disposed in the curved surface or at the bent edge, and, in another embodiment, the display area DA and the non-display area NDA may be disposed in the curved surface or at the bent edge.

The non-display area NDA of the main area MA may be placed in an area ranging from an outer boundary of the display area DA up to an edge of the display panel 100. Drive circuits or a signal wiring for applying a signal to the display area DA may be disposed in the non-display area NDA of the main area MA.

The bending area BA may be connected through one short side of the main area MA. The width of the bending area BA (the width measured in the first direction DR1) may be smaller than or less than the width of the main area MA (the width of the short side measured in the first direction DR1). A connection part between the main area MA and the bending area BA may have an L-shaped cutting shape in order to reduce the width of the bezel.

In the bending area BA, the display panel 100 may be bent with a certain or set curvature in the direction opposite to the display surface (e.g., in a direction opposite to the third direction DR3 as shown in FIG. 2). Because the display panel 100 is bent in the bending area BA, the surface of the display panel 100 may be flipped. That is, one surface of the display panel 100 facing upward may be changed to face outward from a side surface through the bending area BA and then face downward.

The sub-area SA extends from the bending area BA. The sub-area SA may extend in parallel to the main area MA after the bending is completed. The sub-area SA may overlap the main area MA in the thickness direction of the display panel 100. The sub-area SA may overlap the non-display area NDA of the edge of the main area MA. Furthermore, the sub-area SA may overlap the display area DA of the main area MA. The sub-area SA may have the same width as the bending area BA, but the present disclosure is not limited thereto. For example, in one or more embodiments, the sub-area SA may have a greater or lesser width than the bending area BA.

A pad part may be disposed in the sub-area SA of the display panel 100. An external device may be mounted on (or attached onto) the pad part. Examples of the external device may include a driving chip 200, a driving substrate 300 including a flexible printed circuit board or a rigid printed circuit board, and the like. In addition, a wiring connection film, a connector, and the like may be mounted on the pad part as the external device. One or more external devices may be mounted in the sub-area SA. For example, as illustrated in FIGS. 1 and 2, the driving chip 200 may be disposed in the sub-area SA of the display panel 100, and the driving substrate 300 may be attached to one end of the sub-area SA. In this case, the display panel 100 may include both a pad part connected to the driving chip 200 and a pad part connected to the driving substrate 300. In another embodiment, the driving chip may be mounted on a film, and the film may be attached to the sub-area SA of the display panel 100.

The driving chip 200 may be mounted on one surface of the display panel 100 coplanar with the display surface. As described above, because the bending area BA is bent and flipped, the driving chip 200 may be mounted on a surface of the display panel 100 facing downward in the thickness direction such that the upper surface of the driving chip 200 may face downward when the bending area BA is bent and flipped.

The driving chip 200 may be attached to the display panel 100 through an anisotropic conductive film or may be attached to the display panel 100 through ultrasonic adhesive bonding. The lateral width of the driving chip 200 may be smaller than or less than the lateral width of the display panel 100. The driving chip 200 may be disposed at the center of the sub-area SA in the traverse direction (the first direction DR1), and the left and right edges of the driving chip 200 may be spaced apart from the left and right edges of the sub-area SA.

The driving chip 200 may include an integrated circuit for driving the display panel 100. In one or more embodiments, the integrated circuit may be a data driving integrated circuit that generates and provides a data signal, but the present disclosure is not limited thereto. The driving chip 200 is connected to a wiring pad provided on the pad part of the display panel 100 and is configured to provide a data signal toward the wiring pad. Wirings connected to the wiring pad extend toward or connect to pixels to apply a data signal or the like to each pixel.

Figure 3:
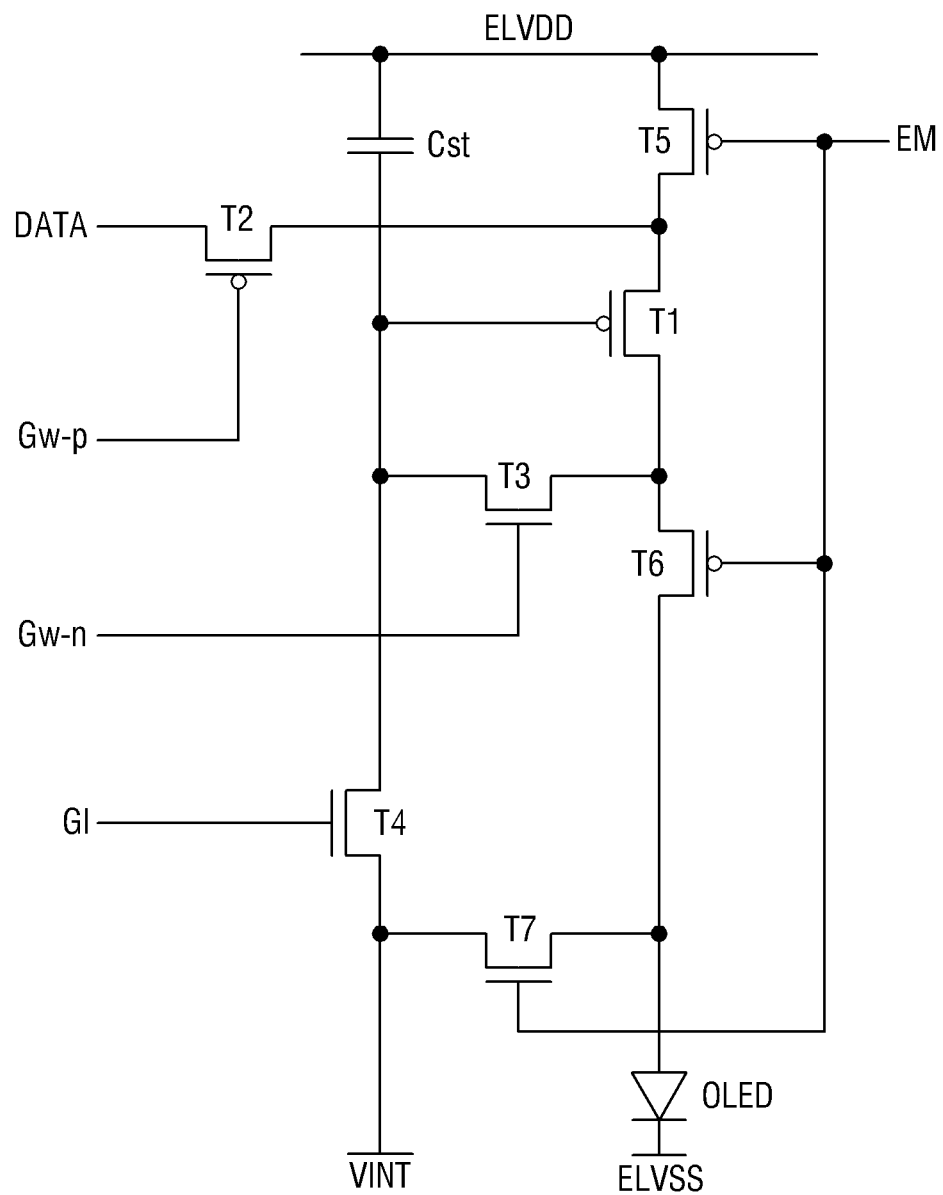
FIG. 3 is an equivalent circuit diagram of one pixel of a display device according to an embodiment.

FIG. 3 is an equivalent circuit diagram of one pixel of a display device according to an embodiment.

Referring to FIG. 3, a circuit of one pixel of an organic light emitting display device includes an organic light emitting diode (OLED), a plurality of transistors T1 to T7 (e.g., a first transistor T1, a second transistor T2, a third transistor T3, a fourth transistor T4, a fifth transistor T5, a sixth transistor T6, and a seventh transistor T7), and a capacitor Cst. A data signal DATA, a first scanning signal Gw-p, a second scanning signal Gw-n, a third scanning signal GI, a light emission control signal EM, a first power supply voltage ELVDD, a second power supply voltage ELVSS, and/or an initialization voltage VINT may be applied to the circuit of the pixel.

The OLED includes an anode electrode and a cathode electrode. The capacitor Cst includes a first electrode and a second electrode.

The plurality of transistors may include the first to seventh transistors T1 to T7. Each of the transistors T1 to T7 includes a gate electrode, a first source/drain electrode, and a second source/drain electrode. Any one of the first source/drain electrode and the second source/drain electrode of each of the transistors T1 to T7 is a source electrode, and the other one is a drain electrode.

Each of the transistors T1 to T7 may be a thin-film transistor. Each of the transistors T1 to T7 may be any one of a p-channel metal-oxide semiconductor (PMOS) transistor and an n-channel metal-oxide semiconductor (NMOS) transistor with suitable changes to the circuit. In one or more embodiments, the first transistor T1 which is a driving transistor, the second transistor T2 which is a data transfer transistor, the fifth transistor T5 which is a first light emitting control transistor, and the sixth transistor T6 which is a second light emitting control transistor are PMOS transistors. In one or more embodiments, the third transistor T3 which is a compensation transistor, the fourth transistor T4 which is a first initialization transistor, and the seventh transistor T7 which is a second initialization transistor are NMOS transistors. A PMOS transistor and an NMOS transistor may have different characteristics. By forming the third transistor T3, the fourth transistor T4, and the seventh transistor T7 using NMOS transistors with relatively good turn-off characteristics, it is possible to reduce the leakage of drive current Id while the OLED emits light.

Each element may be described in more detail below.

The gate electrode of the first transistor T1 is connected to the first electrode of the capacitor Cst. The first source/drain electrode of the first transistor T1 is connected to a first power supply voltage ELVDD terminal via the fifth transistor T5. The second source/drain electrode of the first transistor T1 is connected to an anode electrode of the OLED via (e.g., through) the sixth transistor T6. The first transistor T1 receives a data signal DATA according to a switching operation of the second transistor T2 and supplies the drive current Id to the OLED via the sixth transistor T6.

The gate electrode of the second transistor T2 is connected to the first scanning signal Gw-p terminal. The first source/drain electrode of the second transistor T2 is connected to a data signal DATA terminal. The second source/drain electrode of the second transistor T2 is connected to the first source/drain electrode of the first transistor T1 and is connected to the first power supply voltage ELVDD terminal via the fifth transistor T5. The second transistor T2 is turned on according to the first scanning signal Gw-p to perform a switching operation for delivering or providing the data signal DATA to the first source/drain electrode of the first transistor T1.

The gate electrode of the third transistor T3 is connected to the second scanning signal Gw-n terminal. The first source/drain electrode of the third transistor T3 is connected to the second source/drain electrode of the first transistor T1 and is connected to the anode electrode of the OLED via the sixth transistor T6. The second source/drain electrode of the third transistor T3 is connected to the first electrode of the capacitor Cst, the first source/drain electrode of the fourth transistor T4, and the gate electrode of the first transistor T1. The third transistor T3 is turned on according to the second scanning signal Gn-p to connect the second source/drain electrode and the gate electrode of the first transistor T1 to each other such that diode connection of the first transistor T1 is achieved. Accordingly, a voltage difference is generated between the first electrode and the gate electrode of the first transistor T1 by the threshold voltage of the first transistor T1. By supplying a threshold voltage-compensated data signal DATA to the gate electrode of the first transistor T1, it is possible to compensate for the threshold voltage deviation of the first transistor T1.

The gate electrode of the fourth transistor T4 is connected to the third scanning signal GI terminal. The second source/drain electrode of the fourth transistor T4 is connected to an initialization voltage VINT terminal. The first source/drain electrode of the fourth transistor T4 is connected to the first electrode of the capacitor Cst, the second source/drain electrode of the third transistor T3, and the gate electrode of the first transistor T1. The fourth transistor T4 is turned on according to the third scanning signal GI to perform an operation of transferring an initialization voltage VINT to the gate electrode of the first transistor to initialize the voltage of the gate electrode of the first transistor T1.

The gate electrode of the fifth transistor T5 is connected to a light emission control signal EM terminal. The first source/drain electrode of the fifth transistor T5 is connected to a first power supply voltage ELVDD terminal. The second source/drain electrode of the fifth transistor T5 is connected to the first source/drain electrode of the first transistor T1 and the second source/drain electrode of the second transistor T2.

The gate electrode of the sixth transistor T6 is connected to the light emission control signal EM terminal. The first source/drain electrode of the sixth transistor T6 is connected to the second source/drain electrode of the first transistor T1 and the first source/drain electrode of the third transistor T3. The second source/drain electrode of the sixth transistor T6 is connected to the anode electrode of the OLED.

The fifth transistor T5 and the sixth transistor T6 are turned on concurrently (e.g., simultaneously) according to the light emission control signal EM such that drive current Id flows through the OLED.

The gate electrode of the seventh transistor T7 is connected to the light emission control signal EM terminal. The first source/drain electrode of the seventh transistor T7 is connected to the anode electrode of the OLED. The second source/drain electrode of the seventh transistor T7 is connected to the initialization voltage VINT terminal. The seventh transistor T7 is turned on according to the light emission control signal EM to initialize the anode electrode of the OLED.

The seventh transistor T7 receives the same light emission control signal as those of the fifth transistor T5 and the sixth transistor T6. However, the seventh transistor T7 is an NMOS transistor, and the fifth transistor T5 and the sixth transistor T6 are PMOS transistors. Thus, the seventh transistor T7 may be turned on at different timings from those of the fifth transistor T5 and the sixth transistor T6. For example, when the light emission control signal EM is at a high level, the seventh transistor T7 is turned on, and the fifth transistor T5 and the sixth transistor T6 are turned off. When the light emission control signal EM is at a low level, the seventh transistor T7 is turned off, and the fifth transistor T5 and the sixth transistor T6 are turned on. Therefore, an initialization operation may not be performed by the seventh transistor T7 at the time of light emission when the fifth transistor T5 and the sixth transistor T6 are turned on, and initialization may be achieved by the seventh transistor T7 at the time of non-light emission when the fifth transistor T5 and the sixth transistor T6 are turned off.

In the illustrated embodiment, the gate electrode of the seventh transistor T7 receives a light emission control signal EM. In one or more embodiments, however, a pixel circuit may be configured such that the gate electrode of the seventh transistor T7 receives the third scanning signal GI or such that the gate electrode of the seventh transistor T7 receives a separate scanning signal other than the first, second and third scanning signals Gw-p, Gw-n, and GI. For example, the gate electrode of the seventh transistor T7 may receive a scanning signal independently of the other transistors.

The second electrode of the capacitor Cst is connected to the first power supply voltage ELVDD terminal. The first electrode of the capacitor Cst is connected to the gate electrode of the first transistor T1, the second source/drain electrode of the third transistor T3, and the first source/drain electrode of the fourth transistor T4. The cathode electrode of the OLED is connected to a second power supply voltage ELVSS terminal. The OLED displays pictures or images by receiving drive current Id from the first transistor T1 and emitting light.

Figure 4:
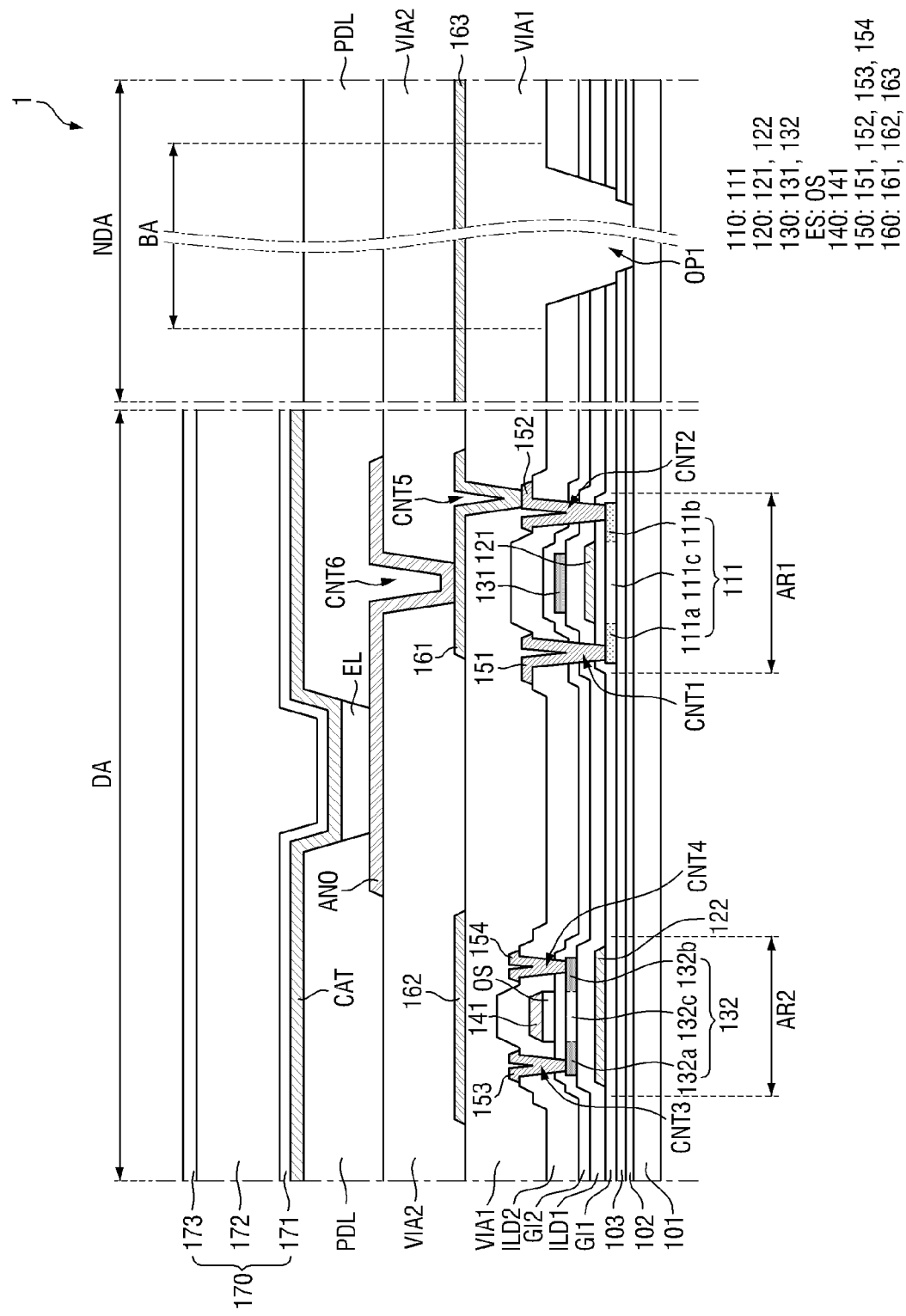
FIG. 4 is a cross-sectional view showing an example section of a periphery of a bending area and a pixel according to an embodiment.

The cross-sectional structure of the display panel 100 may be described in more detail below with reference to FIG. 4. FIG. 4 shows an exemplary cross-sectional structure of the non-display area NDA including the bending area BA and one pixel of the display area DA of the display panel 100.

FIG. 4 is a cross-sectional view showing an example section of a periphery of a bending area and a pixel of a display area.

The display area DA of the display panel 100 may be described with reference to FIG. 4 first.

The display area DA may include a silicon transistor region AR1 where a non-oxide inorganic semiconductor transistor (hereinafter, abbreviated as a "silicon transistor") including polycrystalline silicon is disposed as a channel and an oxide transistor region AR2 where an oxide semiconductor transistor (hereinafter, abbreviated as an "oxide transistor") including oxide semiconductor is disposed as a channel. The silicon transistor disposed in the silicon transistor region AR1 may be a PMOS transistor. In FIG. 4, the first transistor T1, which is a drive transistor, is shown as an example of a silicon transistor. The oxide transistor disposed in the oxide transistor region AR2 may be an NMOS transistor. In FIG. 4, the third transistor T3, which is a compensation transistor, is illustrated as an example of an oxide transistor. The second transistor T2, the fifth transistor T5, and the sixth transistor T6, which are silicon transistors disposed in the silicon transistor region AR1, may each have substantially the same stack structure as that of the first transistor T1. The fourth transistor T4 and the seventh transistor T7, which are oxide transistors disposed in the oxide transistor region AR2, may each have substantially the same stack structure as that of the third transistor T3. The silicon transistor and the oxide transistor may be described in more detail below.

A base substrate 101, a barrier layer 102, a buffer layer 103, a first semiconductor pattern 110, a first gate insulator GI1, a first conductive layer 120, a first interlayer dielectric ILD1, a second semiconductor pattern 130, a second gate insulator GI2, a third semiconductor pattern ES including an oxygen supply layer OS, a second conductive layer 140, a second interlayer dielectric ILD2, a third conductive layer 150, a first via layer VIA1, a fourth conductive layer 160, a second via layer VIA2, a pixel electrode ANO, and a pixel defining layer PDL may be sequentially disposed in the display area DA of the display panel 100. Each of the above layers may be formed as a single film or a stacked film including a plurality of films. In one or more embodiments, other layers may be disposed between the above layers.

The base substrate 101 supports the layers disposed thereon. The base substrate 101 may be made of, for example, an insulating material such as a polymer resin. Examples of the polymer material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (CTA), cellulose acetate propionate (CAP), or a combination thereof. The base substrate 101 may contain a metallic material.

The base substrate 101 may be a flexible substrate which is bendable, foldable, rollable, and/or the like. For example, the material of the flexible substrate may be polyimide (PI), but the present disclosure is not limited thereto.

When the organic light emitting display device is of a bottom emission type or a double-side emission type, a transparent substrate may be used. When the organic light emitting display device is of a top emission type, a translucent, opaque, and/or transparent substrate may be used.

The barrier layer 102 may be disposed on the base substrate 101. The barrier layer 102 can prevent or reduce diffusion of impurity ions, prevent or reduce penetration of moisture or external air, and perform surface planarization. The barrier layer 102 may contain a silicon nitride, silicon oxide, or silicon oxynitride. The barrier layer 102 may be omitted depending on the type, process conditions, or the like of the base substrate 101.

The buffer layer 103 may be disposed on the barrier layer 102. The buffer layer 103 may include at least one of a silicon nitride, silicon oxide, and silicon oxynitride. The buffer layer 103 may be omitted depending on the type, process conditions, or the like of the base substrate 101.

The first semiconductor pattern 110 may be disposed on the buffer layer 103. The first semiconductor pattern 110 may include a silicon semiconductor layer 111, which is an active layer of the silicon transistor. The silicon semiconductor layer 111 may be disposed in the silicon transistor region AR1. The silicon semiconductor layer 111 is a semiconductor layer for the first transistor T1, the second transistor T2, the fifth transistor T5, and the sixth transistor T6 and may form a channel of the corresponding transistors.

The silicon semiconductor layer 111 may contain polycrystalline silicon, monocrystalline silicon, or amorphous silicon. When the silicon semiconductor layer 111 is made of polycrystalline silicon, the polycrystalline silicon may be formed by crystallizing amorphous silicon in a crystallization method such as rapid thermal annealing (RTA), solid phase crystallization (SPC), excimer laser annealing (ELA), metal induced crystallization (MIC), metal induced lateral crystallization (MILC), and sequential lateral solidification (SLS).

The silicon semiconductor layer 111 may include a channel area 111c disposed in the thickness direction to overlap the first gate electrode 121 disposed thereabove and may also include a first source/drain area 111a and a second source/drain area 111b of the silicon semiconductor layer 111 placed on one side and the other side of the channel area 111c. The first and second source/drain areas 111a and 111b of the silicon semiconductor layer 111 contain majority carrier ions and thus may have greater conductivity and lower electrical resistance than the channel area 111c.

The first gate insulator GI1 may be disposed on the first semiconductor pattern 110. The first gate insulator GI1 may cover an upper surface of the silicon semiconductor layer 111 except for portions where contact holes CNT1 and CNT2 are formed and may also cover a side surface of the silicon semiconductor layer 111. Generally, the first gate insulator GI1 may be disposed over the entirety of the base substrate 101.

The first gate insulator GI1 may contain a silicon compound, a metal oxide, etc. For example, the first gate insulator GI1 may contain a silicon oxide, a silicon nitride, a silicon oxynitride, an aluminum oxide, a tantalum oxide, a hafnium oxide, a zirconium oxide, a titanium oxide, and the like. The materials may be used alone or in combination. The first gate insulator GI1 may be a single film or a multilayer film formed as a stacked film of different materials.

The first conductive layer 120 is disposed on the first gate insulator GI1. The first conductive layer 120 may contain one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be a single film or a multilayer film.

The first conductive layer 120 may include a first gate electrode 121 disposed in the silicon transistor region AR1 and a lower gate electrode (or a lower light shielding pattern) 122 disposed in the oxide transistor region AR2.

The first gate electrode 121 may be the gate electrode of the silicon transistor. The first gate electrode 121 may be connected to the first electrode of the capacitor Cst. The first electrode of the capacitor Cst may be the first gate electrode 121 itself (e.g., the first gate electrode 121 may function as the first electrode of the capacitor Cst and vice versa) or may be a portion extending from the first gate electrode 121. For example, a portion of the integrated pattern of the first conductive layer may overlap (e.g., may overlap in the thickness direction) the silicon semiconductor layer 111 to function as the first gate electrode 121 in the corresponding portion, and the other portion may not overlap the silicon semiconductor layer 111 to function as the first electrode of the capacitor Cst overlapping a second capacitor electrode 131 of the capacitor disposed thereabove.

The lower gate electrode 122 may be used as another gate electrode of the oxide transistor. In this case, the lower gate electrode 122 may be electrically connected to any one of a first source/drain electrode 153 and a second source/drain electrode 154 of a transistor disposed in the oxide semiconductor region AR2 or a second gate electrode 141.

In addition, the lower gate electrode 122 may serve or function as a lower light shielding pattern that prevents or substantially prevents light incident from a lower side of the display panel 100 from entering an oxide semiconductor layer 132 disposed thereabove. The lower gate electrode 122 may overlap (e.g., may overlap in a thickness direction) a channel area 132c of the oxide semiconductor layer 132.

In one or more embodiments, the lower gate electrode 122 may not be electrically connected to any one of the first source/drain electrode 153 and the second source/drain electrode 154 of the transistor disposed in the oxide semiconductor region AR2 or the second gate electrode 141. In this case, the lower gate electrode 122 may serve or function as only the lower light shielding pattern.

The first interlayer dielectric ILD1 is disposed on the first conductive layer 120. The first interlayer dielectric ILD1 may contain a silicon compound, a metal oxide, etc. For example, the first interlayer dielectric ILD1 may contain a silicon oxide, a silicon nitride, a silicon oxynitride, an aluminum oxide, a tantalum oxide, a hafnium oxide, a zirconium oxide, a titanium oxide, and the like. The materials may be used alone or in combination. The first interlayer dielectric ILD1 may be a single film or a multilayer film formed as a stacked film of different materials.

The second semiconductor pattern 130 is disposed on the first interlayer dielectric ILD1. The second semiconductor pattern 130 may contain an oxide semiconductor. The oxide may include one or more oxides selected from among G-I-Z-O, zinc (Zn), indium (In), gallium (Ga), tin (Sn), cadmium (Cd), germanium (Ge), hafnium (Hf), and a combination thereof. The oxide may include at least one of indium gallium zinc oxide (IGZO), zinc tin oxide (ZTO), and indium tin oxide (IZO), etc.

The second semiconductor pattern 130 may include the second electrode 131 of the capacitor (hereinafter referred to as a "second capacitor electrode") and the oxide semiconductor layer 132, which is the active layer of the oxide transistor. The second capacitor electrode 131 may be disposed in the silicon transistor region AR1, and the oxide semiconductor layer 132 may be disposed in the oxide transistor region AR2.

The second capacitor electrode 131 may function as the second electrode of the capacitor Cst in an area overlapping the first electrode of the capacitor Cst. For example, the second capacitor electrode 131 may face or oppose a first capacitor electrode connected to the first gate electrode 121 located therebelow, and the first interlayer dielectric ILD1 may be interposed therebetween to form the capacitor Cst.

The present disclosure is not limited thereto, and the second capacitor electrode 131 may be made of the same material as that of the oxide semiconductor layer 132 of the transistor disposed in the oxide transistor region AR2.

The second capacitor electrode 131 and the oxide semiconductor layer 132 of the transistor disposed in the oxide transistor region AR2 may be formed concurrently (e.g., simultaneously) using one mask. As described above, the second capacitor electrode 131 may not be formed through a separate mask process using a separate conductive layer, and the second capacitor electrode 131 is formed concurrently (e.g., simultaneously) with the oxide semiconductor layer 132 of the transistor disposed in the oxide transistor region AR2 using one mask. Thus, it is possible to decrease the number of masks for the process.

The oxide semiconductor layer 132 of the transistor disposed in the oxide transistor region AR2 is a semiconductor layer for the third transistor T3, the fourth transistor T4, and the seventh transistor T7 and may form a channel of the corresponding transistors.

The oxide semiconductor layer 132 may include a channel area 132c disposed in the thickness direction to overlap the second gate electrode 141 disposed thereabove and may also include a first source/drain area 132a and a second source/drain area 132b of the oxide semiconductor layer 132 placed on one side and the other side (e.g., another side opposite to the one side) of the channel area 132c. The first and second source/drain areas 132a and 132b of the oxide semiconductor layer 132 are conductive areas and may have greater conductivity and lower electrical resistance than the channel area 132c.

The second gate insulator GI2 is disposed on the oxide semiconductor layer 132. The second gate insulator GI2 may contain a silicon compound, a metal oxide, etc. For example, the second gate insulator GI2 may contain a silicon oxide, a silicon nitride, a silicon oxynitride, an aluminum oxide, a tantalum oxide, a hafnium oxide, a zirconium oxide, a titanium oxide, and the like. The materials may be used alone or in combination. The second gate insulator GI2 may be a single film or a multilayer film formed as a stacked film of different materials.

The second gate insulator GI2 may cover an upper surface of the oxide semiconductor layer 132 except for portions where contact holes CNT3 and CNT4 are formed and may also cover a side surface of the oxide semiconductor layer 132. In general, the second gate insulator GI2 may be disposed over the entirety of the first interlayer dielectric ILD1.

For example, the second gate insulator GI2 may be formed over the entirety of the first interlayer dielectric ILD1 without separate etching. Thus, the second gate insulator GI2 may be disposed between the second semiconductor pattern 130 and the second conductive layer 140 to cover at least a portion of an upper surface and at least a portion of a side surface of the second semiconductor pattern 130.

The second gate insulator GI2 may cover the channel area 132c of the oxide semiconductor layer 132 and may also cover at least a portion of the first source/drain area 132a and the second source/drain area 132b of the oxide semiconductor layer 132 placed on one side and the other side of the channel area 132c. In addition, the second gate insulator GI2 may cover at least a portion of an upper surface and at least a portion of a side surface of the channel area 132c of the transistor disposed in the oxide transistor region AR2, may cover at least a portion of upper surfaces of the first and second source/drain areas 132a and 132b of the transistor disposed in the oxide transistor region AR2, and may cover at least a portion of side surfaces of the first and second source/drain areas 132a and 132b of the transistor disposed in the oxide transistor region AR2. A lower surface of the second semiconductor pattern 130 may be covered by the first interlayer dielectric ILD1. That is, the second semiconductor pattern 130 except for portions where the contact holes CNT3 and CNT4 are formed may be sealed by the first interlayer dielectric ILD1 and the second gate insulator GI2.

By forming the second gate insulator GI2 without separate etching, it is possible to maintain the thickness between the first conductive layer 120 and the second conductive layer 140 although the first interlayer dielectric ILD1 is used as the dielectric of the capacitor Cst. Accordingly, it is possible to suppress or prevent a parasitic capacitor (e.g., parasitic capacitance) between the first conductive layer 120 and the second conductive layer 140, and it is also possible to suppress or prevent a break voltage (e.g., a breakdown voltage). In addition, when the second gate insulator GI2 is etched, an upper portion of the first interlayer dielectric ILD1 disposed below the second gate insulator GI2 is partially etched, and thus the uniformity of the capacitor Cst may be decreased. In this case, it is possible to prevent or reduce the decrease in uniformity by excluding the etching of the second gate insulator GI2.

The third semiconductor pattern ES including the oxygen supply layer OS is disposed on the second gate insulator GI2. However, the present disclosure is not limited thereto. For example, the third semiconductor pattern ES including the oxygen supply layer OS may be disposed on the second semiconductor pattern 130 and may be brought into contact (e.g., direct contact) with the second semiconductor pattern 130.

The third semiconductor pattern ES may contain at least one of materials constituting the second semiconductor pattern 130. Also, the present disclosure is not limited thereto. For example, the third semiconductor pattern ES may be made of the same material as the second semiconductor pattern 130. In one or more embodiments, the third semiconductor pattern ES may be formed in substantially the same pattern as the second conductive layer 140. For example, the third semiconductor pattern ES and the second conductive layer 140 may completely overlap each other, but the present disclosure is not limited thereto. For example, the third semiconductor pattern ES may overlap at least a portion of the second conductive layer 140. Therefore, in one or more embodiments, the semiconductor pattern ES may overlap less than the entire second conductive layer 140.

The oxygen supply layer OS may refer to a region that is disposed between the second conductive layer 140 and the second semiconductor pattern 130 in the third semiconductor pattern ES and that overlaps (e.g., overlaps in the thickness direction) the second conductive layer 140 and also overlaps the second semiconductor pattern 130. In particular, the oxygen supply layer OS may overlap the second gate electrode 141 and/or the channel area 132c of the transistor disposed in the oxide transistor region AR2. However, the present disclosure is not limited thereto. For example, the oxygen supply layer OS may have substantially the same shape as the second gate electrode 141 and/or the channel area 132c of the transistor disposed in the oxide transistor region AR2. Accordingly, a side surface of the oxygen supply layer OS may be aligned (e.g., may be aligned in the thickness direction) with a side surface of the second gate electrode 141 and may also be aligned with a side surface of the channel area 132c of the transistor disposed in the oxide transistor region AR2. In one or more embodiments, in a cross-sectional view as shown in FIG. 4, a side surface of the oxygen supply layer OS may be parallel or substantially parallel to a side surface of the second gate electrode 141 and may also be parallel or substantially parallel to a side surface of the channel area 132c of the transistor disposed in the oxide transistor region AR2

The oxygen supply layer OS may return a portion of the conductive oxide semiconductor layer 132 to a semiconductor layer to form the channel area 132c of the transistor disposed in the oxide transistor region AR2. In other words, the oxygen supply layer OS may cause a portion of the conductive oxide semiconductor layer 132 to revert back or change to a semiconductor layer to form the channel area 132c of the transistor disposed in the oxide transistor region AR2. For example, oxygen may be supplied to the oxide semiconductor layer 132 overlapping the oxygen supply layer OS by oxygen plasma in a deposition process for the third semiconductor pattern ES including the oxygen supply layer OS and may be supplied to the oxide semiconductor layer 132 overlapping the oxygen supply layer OS through a heat treatment process after the oxygen supply layer OS is deposited. Thus, by a process performed before the gate insulator GI2 is formed, a partial region of the conductive oxide semiconductor layer 132 may be returned to a semiconductor layer. The region returned to the semiconductor layer may be the channel area 132c of the transistor disposed in the oxide transistor region AR2, and still conductive parts disposed in one side and the other side (e.g., a side opposite to the one side) of the channel area 132c may be the first and second source/drain areas 132a and 132b of the transistor disposed in the oxide transistor region AR2. In other words, the region reverted back or changed to the semiconductor layer may be the channel area 132c of the transistor disposed in the oxide transistor region AR2.

The oxygen supply layer OS may supply oxygen to the oxide semiconductor layer 132 and also to the second gate electrode 141 disposed above the oxygen supply layer OS and even the second gate insulator GI2 disposed between the oxygen supply layer OS and the oxide semiconductor layer 132.

The second gate electrode 141 disposed above the oxygen supply layer OS receives oxygen ($O_2$) from the oxygen supply layer OS such that a portion thereof may be oxidized. For example, when the second gate electrode 141 is made of molybdenum (Mo), the second gate electrode 141 is oxidized such that a portion thereof may be made of a molybdenum oxide ($Mo_xO_y$). When a region is closer to the oxygen supply layer OS in the second gate electrode 141, the region can receive more oxygen ($O_2$). As a distance from the oxygen supply layer OS decreases, the concentration of oxygen ($O_2$) may increase. Accordingly, the concentration of oxidized metal may increase as a distance from the oxygen supply layer OS decreases in the second gate electrode 141.

The second gate insulator GI2 disposed below the oxygen supply layer OS may receive oxygen ($O_2$) from the oxygen supply layer OS and may have different oxygen ($O_2$) concentrations for each region. For example, a part of the second gate insulator GI2 that overlaps and is in contact (e.g., direct contact) with the oxygen supply layer OS may have a higher oxygen ($O_2$) concentration than the other parts of the gate insulator GI2. Also, as a distance from the part of the second gate insulator GI2 increases, the concentration of the oxygen ($O_2$) contained in the second gate insulator GI2 may decrease.

As a result, by placing the third semiconductor pattern ES between the second conductive layer 140 and the second semiconductor pattern 130 and forming the third semiconductor pattern ES using the same mask as that of the second conductive layer 140, the conductive part of the third semiconductor pattern ES may be selectively returned (or selectively changed) to a semiconductor layer to form the channel area 132c. In this manner, the oxygen supply layer OS may form the channel area 132c of the transistor disposed in the oxide transistor region AR2. This may be described in more detail below.

In addition, by placing the third semiconductor pattern ES between the second conductive layer 140 and the second semiconductor pattern 130, an etching second gate insulating film step of manufacturing the display device 1 may not be desirable. Without the etching second gate insulating film step, the insulating effect of the second gate insulating film GI2 may increase. Moreover, not performing the etching second gate insulating film step may prevent or substantially prevent the first interlayer dielectric ILD1 from being over etched by the etching second gate insulating film step of manufacturing the display device 1. Therefore, not performing the etching second gate insulating film step may prevent or substantially prevent a uniformity of a capacitance of the capacitor Cst from decreasing.

The second conductive layer 140 is disposed on the third semiconductor pattern ES. The second conductive layer 140 may include the second gate electrode 141 of the transistor disposed in the oxide transistor region AR2. The second conductive layer 140 may contain one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 140 may be a single film or a multilayer film.

The second interlayer dielectric ILD2 is disposed on the second conductive layer 140. The second interlayer dielectric ILD2 may contain a silicon compound, a metal oxide, etc. For example, the second interlayer dielectric ILD2 may contain a silicon oxide, a silicon nitride, a silicon oxynitride, an aluminum oxide, a tantalum oxide, a hafnium oxide, a zirconium oxide, a titanium oxide, and the like. The materials may be used alone or in combination. The second interlayer dielectric ILD2 may be a single film or a multilayer film formed as a stacked film of different materials.

The third conductive layer 150 is disposed on the second interlayer dielectric ILD2. The third conductive layer 150 may contain one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 150 may be a single film or a multilayer film.

The third conductive layer 150 may include a first source/drain electrode 151 and a second source/drain electrode 152 of the transistor disposed in the silicon transistor region AR1 and a first source/drain electrode 153 and a second source/drain electrode 154 of the transistor disposed in the oxide transistor region AR2.

In one or more embodiments, the first source/drain electrode 151 of the transistor disposed in the silicon transistor region AR1 may be connected to the first source/drain area 111a of the silicon semiconductor layer 111 through the first contact hole CNT1 exposing the first source/drain area 111a of the silicon semiconductor layer 111 by passing or extending through the second interlayer dielectric ILD2, the first interlayer dielectric ILD1, and the first gate insulator GI1. The second source/drain electrode 152 may be connected to the second source/drain area 111b of the silicon semiconductor layer 111 through the second contact hole CNT2 exposing the second source/drain area 111b of the silicon semiconductor layer 111 by passing or extending through the second interlayer dielectric ILD2, the first interlayer dielectric ILD1, and the first gate insulator GI1.

In one or more embodiments, the first source/drain electrode 153 of the transistor disposed in the oxide transistor region AR2 may be connected to the first source/drain area 132a of the oxide semiconductor layer 132 through the third contact hole CNT3 exposing the first source/drain area 132a of the oxide semiconductor layer 132 by passing or extending through the second interlayer dielectric ILD2. The second source/drain electrode 154 may be connected to the second source/drain area 132b of the oxide semiconductor layer 132 through the fourth contact hole CNT4 exposing the second source/drain area 132b of the oxide semiconductor layer 132 by passing or extending through the second interlayer dielectric ILD2.

The first via layer VIA1 is disposed on the third conductive layer 150. The first via layer VIA1 is made of an inorganic insulating material or an organic insulating material such as polyacrylate resin, epoxy resin, phenolic resin, polyamide resin, polyimide resin, unsaturated polyester resin, polyphenylene ether resin, polyphenylene sulfide resin, or benzocyclobutene (BCB). The first via layer VIA1 may be a single film or a multilayer film formed as a stacked film of different materials.

The fourth conductive layer 160 is disposed on the first via layer VIA1. The fourth conductive layer 160 may contain one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 160 may be a single film or a multilayer film.

The fourth conductive layer 160 may include a connection electrode 161 and an upper light shielding pattern 162. A fifth contact hole CNT5 exposing the second source/drain electrode 152 of the transistor disposed in the silicon semiconductor region AR1 may be disposed in the first via layer VIA1, and the connection electrode 161 may be connected to the second source/drain electrode 152 of the transistor disposed in the silicon transistor region AR1 through the fifth contact hole CNT5. That is, the connection electrode 161 may connect an anode electrode ANO located thereabove to the second source/drain electrode 152 of the transistor disposed in the silicon transistor region AR1 located therebelow.

The upper light shielding pattern 162 may serve or function to prevent or substantially prevent light incident from the upper portion of the display panel 100 from entering the oxide semiconductor layer 132 located below the upper light shielding pattern 162. The upper light shielding pattern 162 may be disposed to at least overlap the channel area 132c of the oxide semiconductor layer 132.

The second via layer VIA2 is disposed on the connection electrode 161. The second via layer VIA2 is made of an inorganic insulating material or an organic insulating material such as polyacrylate resin, epoxy resin, phenolic resin, polyamide resin, polyimide resin, unsaturated polyester resin, polyphenylene ether resin, polyphenylene sulfide resin, or benzocyclobutene (BCB). The second via layer VIA2 may be a single film or a multilayer film formed as a stacked film of different materials.

The pixel electrode ANO is disposed on the second via layer VIA2. The pixel electrode ANO may be an anode electrode. The pixel electrode ANO may be separated for each pixel. For example, each pixel may have a corresponding pixel electrode ANO. The pixel electrode ANO may be electrically connected to the connection electrode 161 through a sixth contact hole CNT6 exposing a portion of the connection electrode 161 by passing or extending through the second via layer VIA2.

The pixel electrode ANO is not limited thereto, but may have a stacked film structure where a high-work-function material layer such as indium-tin-oxide (ITO), indium-zinc-oxide (IZO), zinc oxide (ZnO), and indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or mixtures thereof are stacked. The high-work-function material layer may be disposed above the reflective material layer, and thus, may be disposed close to an emission layer EL. The pixel electrode ANO may have a multilayer structure of ITO/Mg, ITO/MgF, ITO/Ag, and ITO/Ag/ITO, but the present disclosure is not limited thereto.

The pixel defining layer PDL may be disposed on the pixel electrode ANO. The pixel defining layer PDL may include an opening for partially exposing the pixel electrode ANO. The pixel defining layer PDL may be made of an organic insulating material or an inorganic insulating material. For example, the pixel defining layer PDL may contain at least one of polyimide resin, acrylic resin, silicon compound, and polyacrylic resin.

The emission layer EL is disposed in the pixel electrode ANO exposed by the pixel defining layer PDL. The emission layer EL may contain an organic material layer. The organic material layer of the emission layer may include an organic emission layer and may further include a hole injection/transport layer and/or an electron injection/transport layer.

A cathode electrode CAT may be disposed on the emission layer EL. The cathode electrode CAT may be a common electrode that is entirely disposed without distinction of pixels PX. For example, the cathode electrode CAT may be disposed over the entire surface of the emission layer EL regardless of the position of the pixels PX. In one or more embodiments, the pixels PX share the cathode electrode CAT as a common electrode. The pixel electrode ANO, the emission layer EL, and the cathode electrode CAT may constitute an organic light emitting device.

The cathode electrode CAT may include a low-work-function material layer, such as Li, Ca, LiF/Ca, LiF/Al, Al, Mg, Ag, Pt, Pd, Ni, Au, Nd, Ir, Cr, BaF, Ba or compounds or mixtures thereof (e.g., a mixture of Ag and Mg, etc.). The cathode electrode CAT may further include a transparent metal oxide layer disposed on the low-work-function material layer.

The pixel electrode ANO, the emission layer EL, and the cathode electrode CAT may constitute an organic light emitting device.

A thin-film encapsulation layer 170 including a first inorganic film 171, a first organic film 172, and a second inorganic film 173 is disposed above the cathode electrode CAT. The first inorganic film 171 and the second inorganic film 173 may be in contact with each other at an end portion of the thin-film encapsulation layer 170. The first organic film 172 may be sealed by the first inorganic film 171 and the second inorganic film 173.

The first inorganic film 171 and the second inorganic film 173 may contain a silicon nitride, silicon oxide, or silicon oxynitride. The first organic film 172 may contain an organic insulating material.

The non-display area NDA may be described in more detail below.

A base substrate 101, a barrier layer 102, a buffer layer 103, a first gate insulator GI1, a first interlayer dielectric ILD1, a second gate insulator GI2, a second interlayer dielectric ILD2, a first via layer VIA1, a fourth conductive layer 160, a second via layer VIA2, and a pixel defining layer PDL may be sequentially disposed in the non-display area NDA of the display panel 100. Each of the above layers may be formed as a single film or a stacked film including a plurality of films. Another layer may be disposed between the above layers.

The non-display area NDA may include a bending area BA and a bending opening OP1.

The bending area BA in the non-display area NDA may be an area where the barrier layer 102, the buffer layer 103, the first gate insulator GI1, the first interlayer dielectric ILD1, and the second interlayer dielectric ILD2 are not disposed (e.g., omitted) and which exposes an upper surface of the base substrate 101.

The bending opening OP1 in the non-display area NDA may pass through (or be defined by) the barrier layer 102, the buffer layer 103, the first gate insulator GI1, the first interlayer dielectric ILD1, the second gate insulator GI2, and the second interlayer dielectric ILD2 and may expose a portion of the base substrate 101. The bending opening OP1 may expose side surfaces of the barrier layer 102, the buffer layer 103, the first gate insulator GI1, the first interlayer dielectric ILD1, the second gate insulator GI2, and the second interlayer dielectric ILD2. The exposed side surfaces of the barrier layer 102 and the buffer layer 103 may be aligned with each other, and the exposed side surfaces of the first gate insulator GI1, the first interlayer dielectric ILD1, the second gate insulator GI2, and the second interlayer dielectric ILD2 may be aligned with each other. Also, the aligned side surfaces of the barrier layer 102 and the buffer layer 103 may protrude a certain or set distance from the aligned side surfaces of the first gate insulator GI1, the first interlayer dielectric ILD1, the second gate insulator GI2, and the second interlayer dielectric ILD2, but the present disclosure is not limited thereto.

Figure 11:
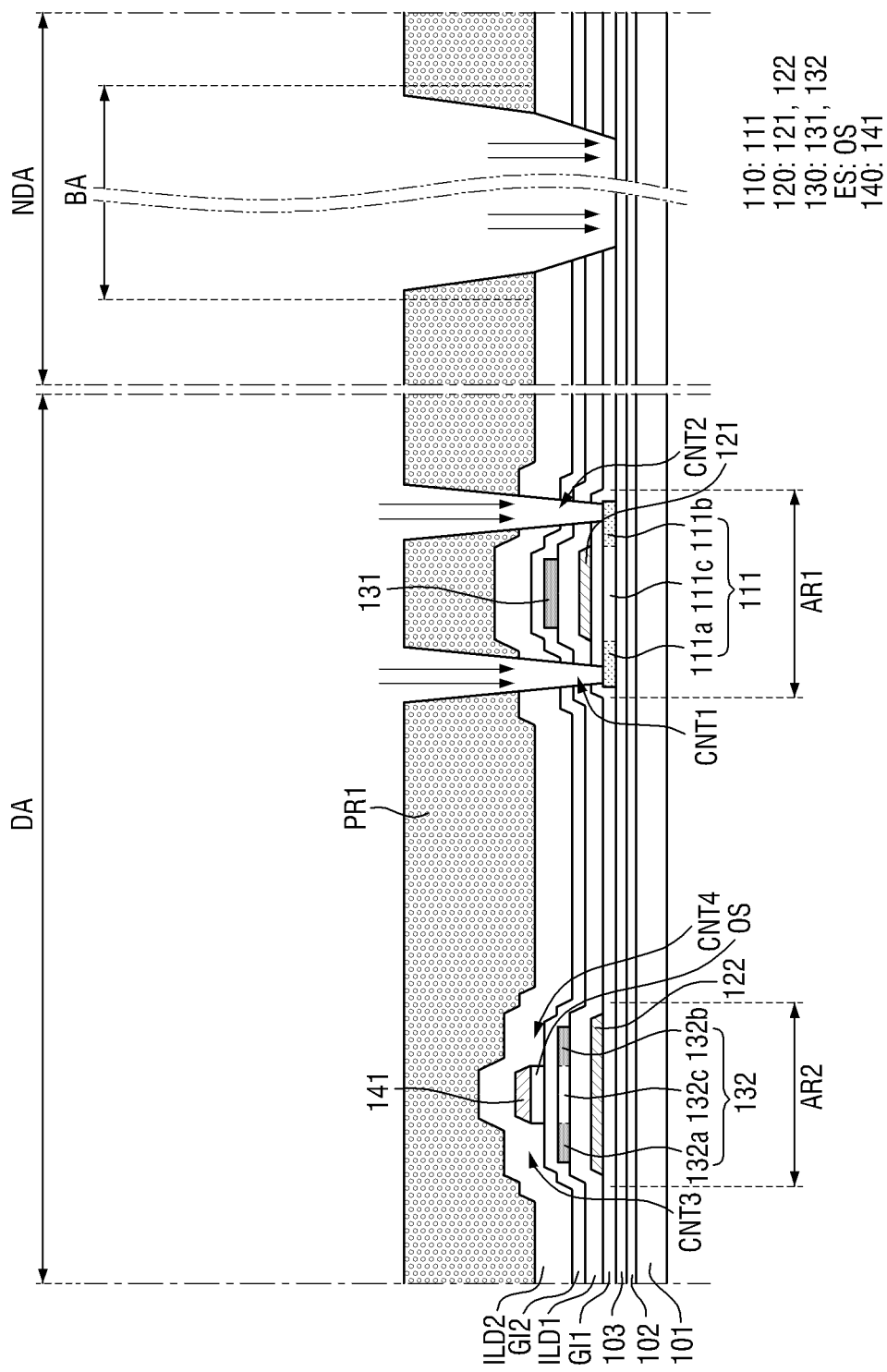
Figure 12:
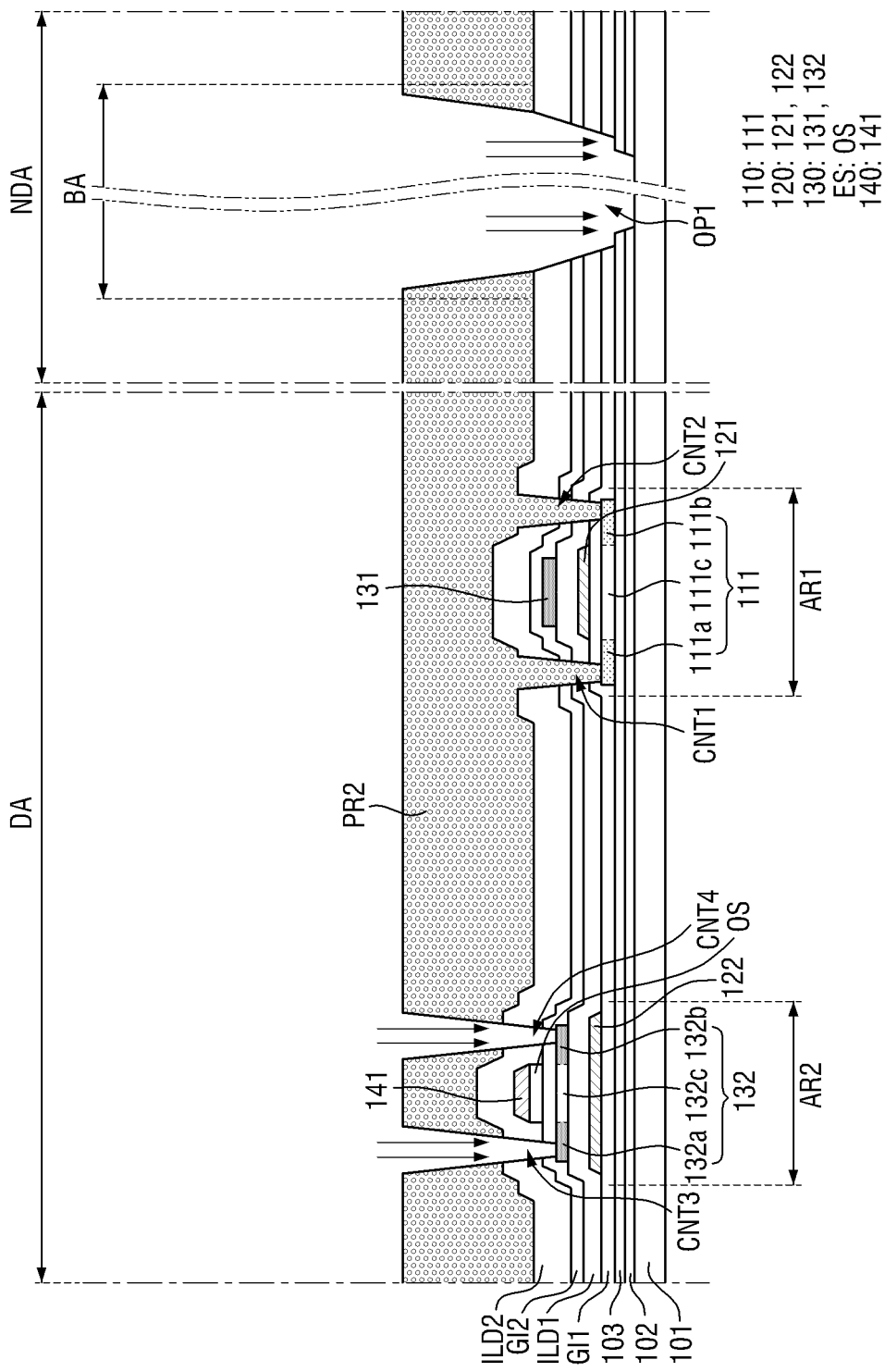

The bending opening OP1 may be formed in a process of forming the first contact hole CNT1 to the fourth contact hole CNT4 (e.g., forming the first contact hole CNT1 and the second contact hole CNT2 as shown in FIG. 11 and forming the third contact hole CNT3 and the fourth contact hole CNT4 as shown in FIG. 12), which may be described in more detail below. By forming the bending opening OP1, it is possible to prevent or reduce a bending stress that may be generated when the above-described display device 1 is bent in the bending area BA.

The bending opening OP1 may be filled with the first via layer VIA1. The first via layer VIA1 may be disposed on the second interlayer dielectric ILD2 in the non-display area NDA and may be disposed on the exposed side surfaces of the barrier layer 102, the buffer layer 103, the first gate insulator GI1, the first interlayer dielectric ILD1, the second gate insulator GI2, and the second interlayer dielectric ILD2 in the bending area BA. The first via layer VIA1 may be in contact (e.g., direct contact) with the exposed upper surface of the base substrate 101.

A connection wiring 163 may be disposed on the first via layer VIA1 in the non-display area NDA and the bending area BA. The connection wiring 163 may be formed from the fourth conductive layer 160. The connection wiring 163 may be formed together with the above-described connection electrode 161 and may be made of the same material as the connection electrode 161.

The second via layer VIA2 and the pixel defining layer PDL may be disposed on the connection wiring 163. At least one of the second via layer VIA2 and the pixel defining layer PDL may be omitted in the non-display area NDA.

A method of manufacturing a display device according to one or more embodiments may be described in more detail below.

Figure 5:
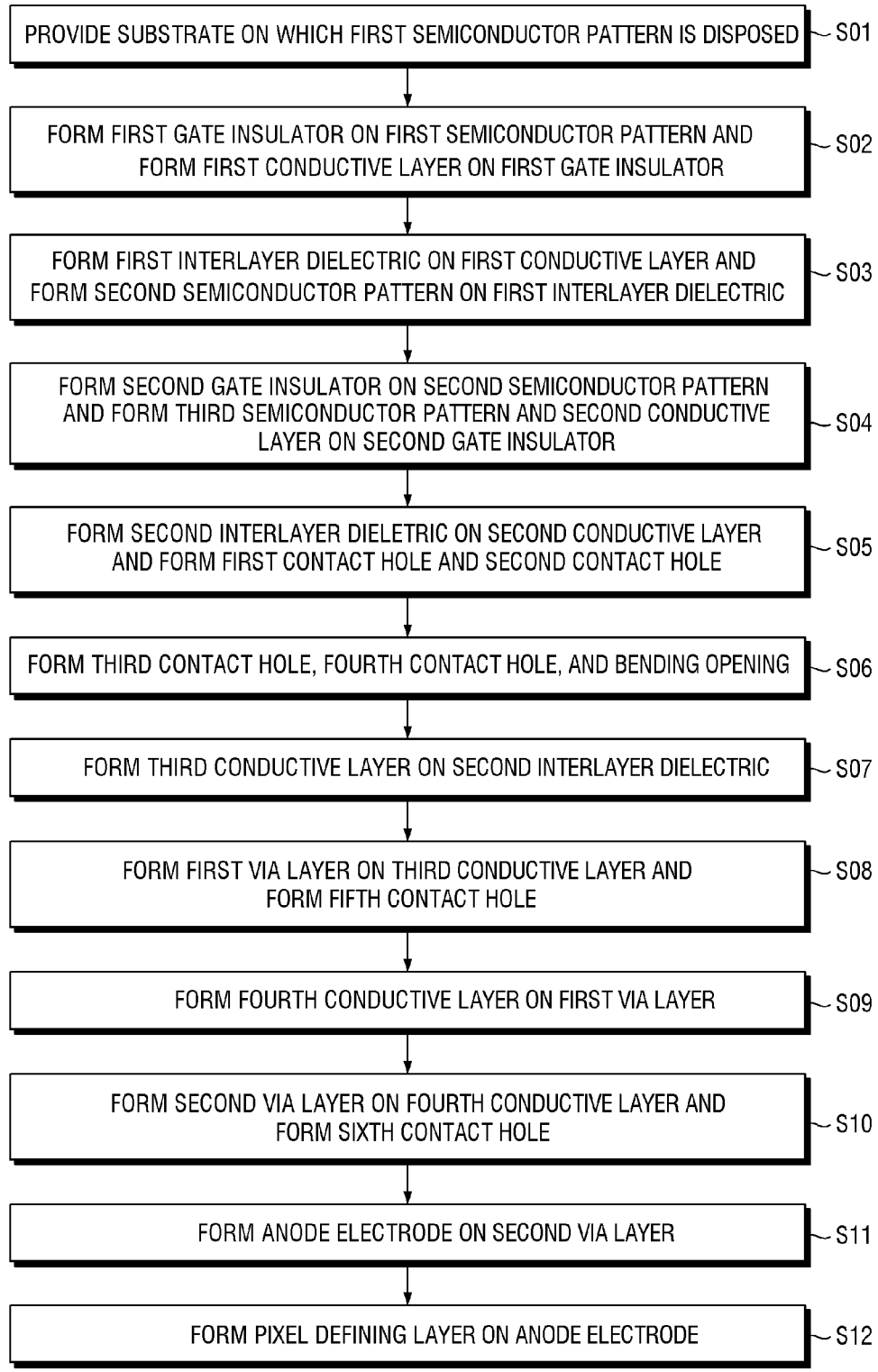
FIG. 5 is a flowchart showing a method of manufacturing a display device according to an embodiment.

FIG. 5 is a flowchart showing a method of manufacturing a display device according to an embodiment, and FIGS. 6-18 are cross-sectional views illustrating processing operations of the method of manufacturing a display device according to an embodiment.

Referring to FIG. 5, a base substrate 101 is provided. On the base substrate 101, a display area DA including a silicon transistor region AR1 and an oxide transistor region AR2 and a non-display area NDA disposed around the display area DA are defined, and a silicon semiconductor layer 111 is disposed in the silicon transistor region AR1 (S01).

Figure 6:
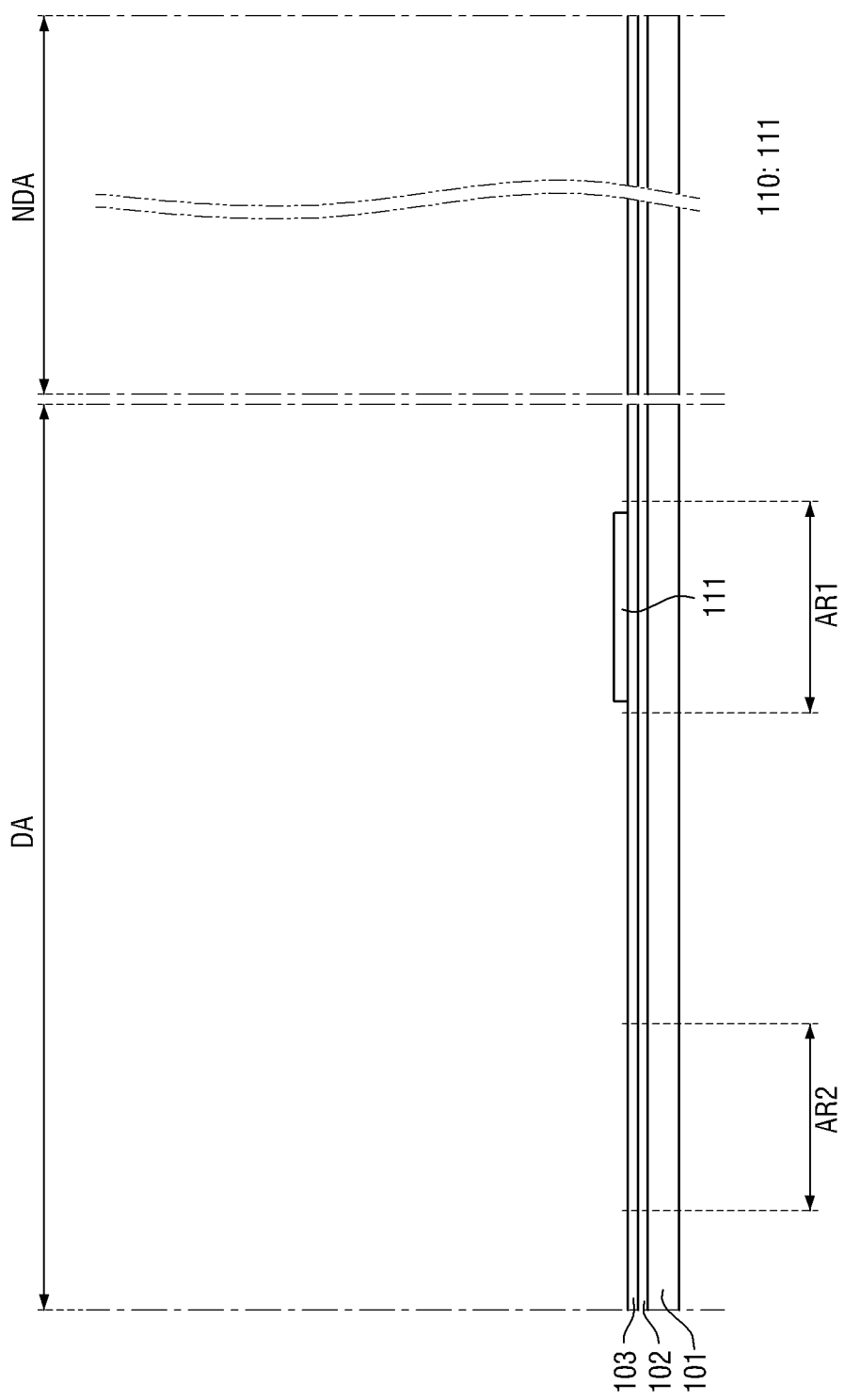
FIGS. 6-18 are cross-sectional views illustrating processing operations of a method of manufacturing a display device according to an embodiment.

For example, a first semiconductor pattern including a silicon semiconductor layer 111 as shown in FIG. 6 may be formed by sequentially stacking a barrier layer 102 and a buffer layer 103 on the base substrate 101, depositing a first semiconductor pattern-specific material over the entirety of the buffer layer 103, and performing patterning through a photolithography process.

Figure 7:
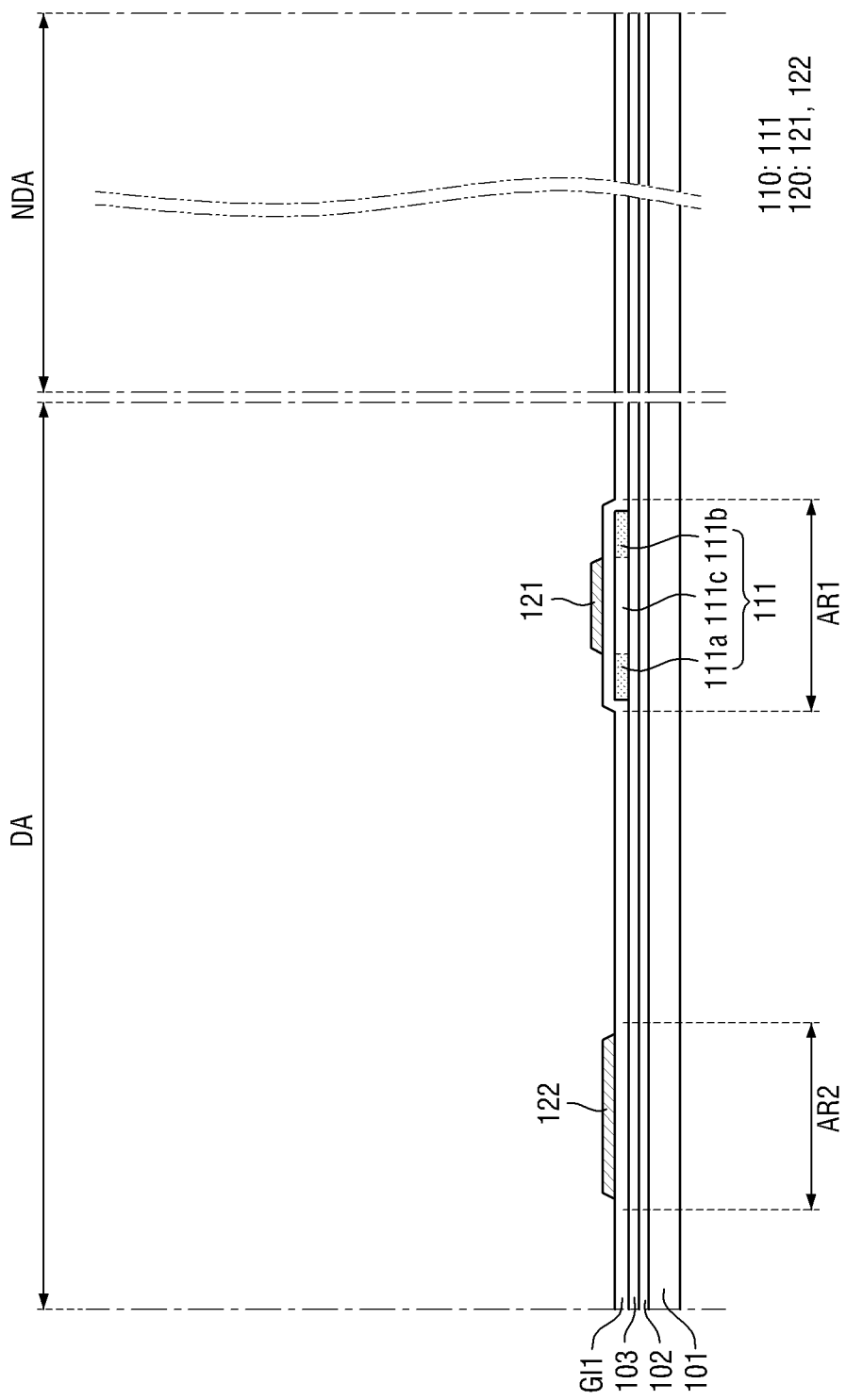

Subsequently, referring to FIG. 7, a first gate insulator GI1 is formed on the silicon semiconductor layer 111, and a first conductive layer 120 including a first gate electrode 121 and a lower gate electrode 122 may be formed on the first gate insulator GI1 (S02).

For example, the first gate insulator GI1 is formed on the entire surface of the buffer layer 103 where the first semiconductor pattern 110 is formed. Subsequently, the first gate electrode 121 and the lower gate electrode 122 are formed on the first gate insulator GI1 concurrently (e.g., simultaneously). The first gate electrode 121 and the lower gate electrode 122 may be patterned through one mask process. That is, the first gate electrode 121 and the lower gate electrode 122 as shown in FIG. 7 may be formed by depositing a first conductive layer-specific material layer over the entirety of the first gate insulator GI1 and then performing patterning through a photolithography process.

Figure 8:
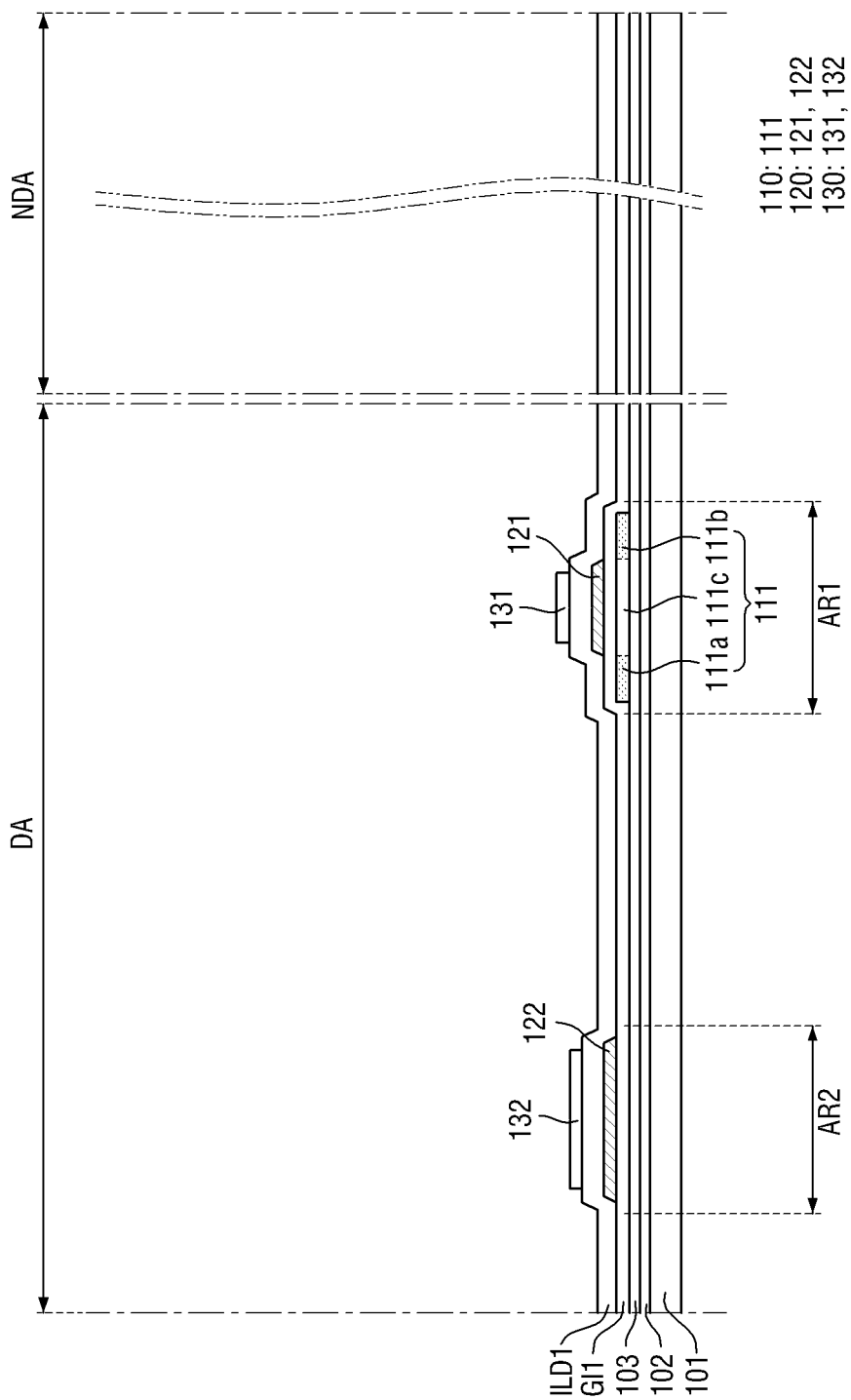

Subsequently, referring to FIGS. 8 and 9, the first interlayer dielectric ILD1 is formed on the first gate electrode 121 and the lower gate electrode 122, and a second semiconductor pattern 130 including a second capacitor electrode 131 and an oxide semiconductor layer 132 is formed on the first interlayer dielectric ILD1 (S03).

For example, the first interlayer dielectric ILD1 is formed on the entire surface of the first gate insulator GI1 where the first gate electrode 121 and the lower gate electrode 122 are formed. Subsequently, the second semiconductor pattern 130 including the second capacitor electrode 131 and the oxide semiconductor layer 132 is formed on the first interlayer dielectric ILD1. The oxide semiconductor layer 132 may be formed by a mask process. For example, the second semiconductor pattern 130 as shown in FIG. 8 may be formed by depositing a second semiconductor pattern-specific material over the entirety of the first interlayer dielectric ILD1 and then performing patterning through a photolithography process.

Figure 9:
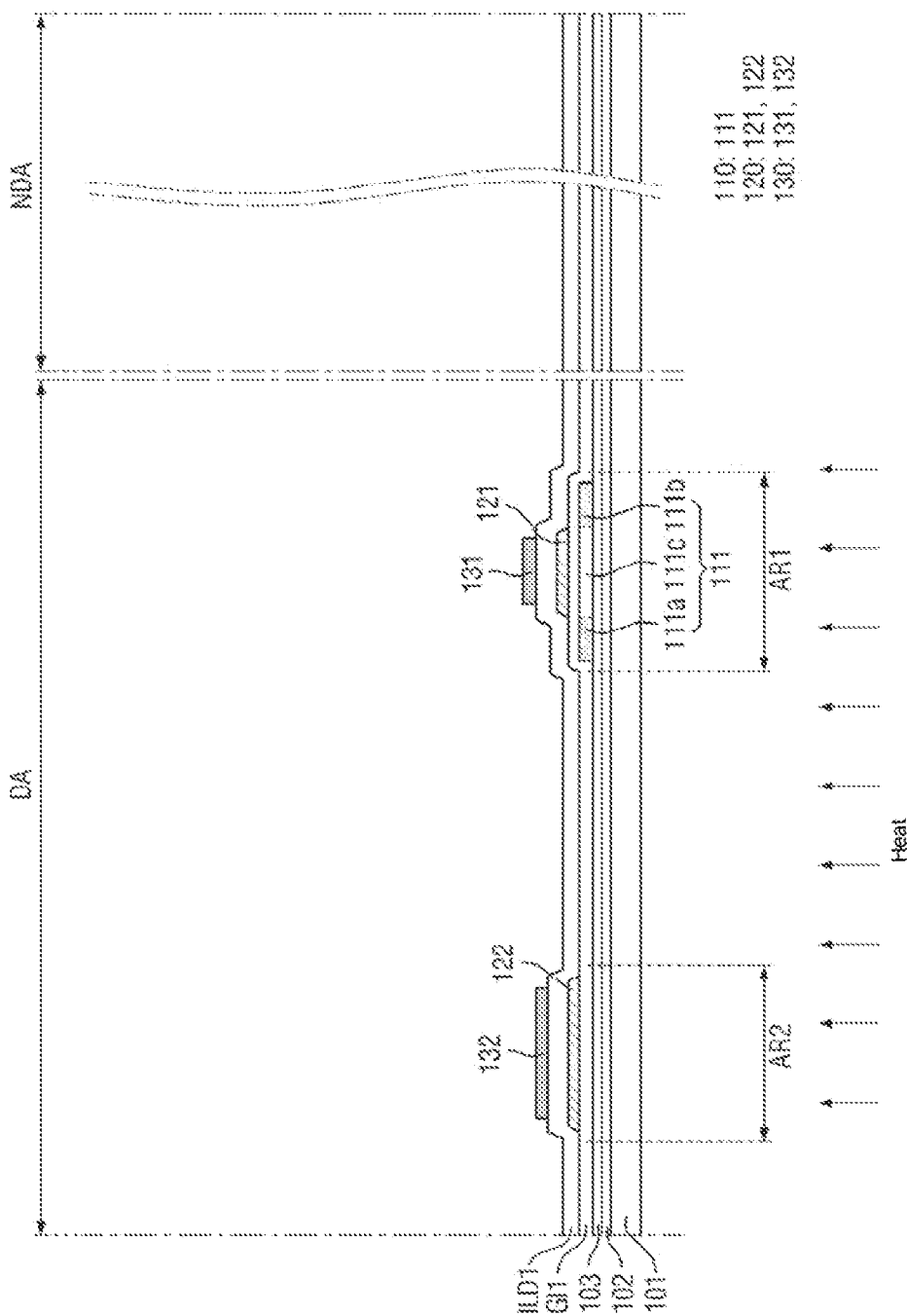

After the substrate 101, the barrier layer 102, the buffer layer 103, the first semiconductor pattern 110, the first gate insulator GI1, the first conductive layer 120, the first interlayer dielectric ILD1, and the second semiconductor pattern 130 are stacked, a heat treatment process may be performed as shown in FIG. 9. In this case, hydrogen ($H_2$) may be emitted from the first interlayer dielectric ILD1 and the buffer layer 103 disposed below the second semiconductor pattern 130. The emitted hydrogen ($H_2$) may be introduced into the second semiconductor pattern 130. Thus, the second capacitor electrode 131 and the oxide semiconductor layer 132 may become conductive as a whole.

Hydrogen ($H_2$) may be additionally supplied to the second semiconductor pattern 130 by the heat treatment process. By way of example, in one or more embodiments, additional hydrogen may be supplied in addition to hydrogen emitted from the first interlayer dielectric ILD1 and the buffer layer 103. Thus, the second semiconductor pattern 130 may be supplied with sufficient hydrogen ($H_2$) and become conductive even if the second semiconductor pattern 130 does not directly contact the second interlayer dielectric ILD2 because of the second gate insulator GI2.

Figure 10:
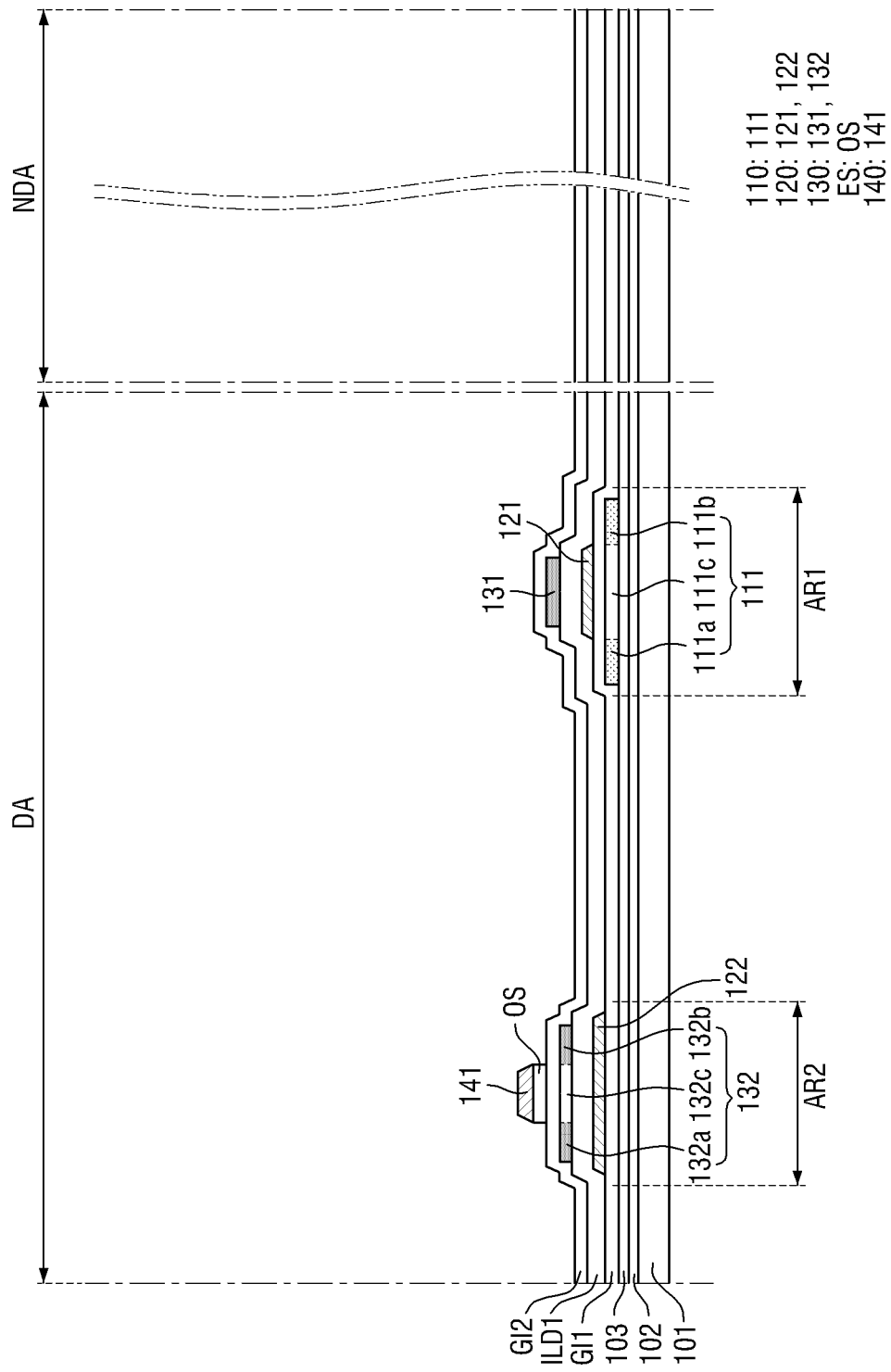

Subsequently, referring to FIG. 10, a second gate insulator GI2 is formed on the second semiconductor pattern 130, and a second conductive layer 140 including a second gate electrode 141 and a third semiconductor pattern ES including an oxygen supply layer OS may be formed on the second gate insulator GI2 (S04).

For example, the second gate insulator GI2 is formed on the entire surface of the first interlayer dielectric ILD1 where the second semiconductor pattern 130 is formed. The second conductive layer 140 including the second gate electrode 141 and the third semiconductor pattern ES including the oxygen supply layer OS are formed on the second gate insulator GI2.

The third semiconductor pattern ES and the second conductive layer 140 may be patterned through one mask process. By forming the third semiconductor pattern ES using the same mask as the second conductive layer 140, the third semiconductor pattern ES may be formed in substantially the same pattern as the second conductive layer 140.

A third semiconductor pattern-specific material layer is deposited over the entire surface of the second gate insulator GI2, and a second gate electrode-specific material layer is sequentially deposited on the entire surface of the entirely deposited third semiconductor pattern-specific material layer. Subsequently, a photoresist pattern is formed by applying a photoresist layer onto the second gate electrode-specific material layer and performing exposure and development, and then the second gate electrode-specific material layer and the third semiconductor pattern-specific material layer are sequentially etched using the formed photoresist pattern as an etching mask. Subsequently, the photoresist pattern is removed through a stripping and/or ashing process. In the above example, the photoresist pattern is used as an etching mask until the pattering for the third semiconductor pattern ES, but a patterned upper layer may be used as a hard mask for etching a lower layer. In this case, the photoresist pattern may be used as the etching mask as well as the hard mask. As another example, a lower layer may be etched by forming a hard mask, removing a photoresist pattern, and then using the hard mask as an etching mask.

Subsequently, referring to FIG. 11, a second interlayer dielectric ILD2 is stacked on the second conductive layer 140, and a first contact hole CNT1 and a second contact hole CNT2 exposing a portion of the silicon semiconductor layer 111 are formed in the display area DA (S05).

The contact holes CNT1 and CNT2 may be formed using one mask process. The first contact hole CNT1 and the second contact hole CNT2 may be concurrently (e.g., simultaneously) formed by the same mask. For example, a second interlayer dielectric-specific insulating layer is entirely deposited over the entirety of the first interlayer dielectric ILD1 where the second semiconductor pattern 130, the third semiconductor pattern ES, and the second conductive layer 140 are formed. Subsequently, a first photoresist pattern PR1 exposing a portion of the silicon semiconductor layer 111 is formed on the second interlayer dielectric-specific insulating layer, and the second interlayer dielectric-specific insulating layer, the second gate insulator GI2, the first interlayer dielectric ILD1, and the first gate insulator GI1 are etched using the first photoresist pattern PR1 as an etching mask to form the first contact hole CNT1 and the second contact hole CNT2 exposing a portion of the silicon semiconductor layer 111.

In addition, the bending opening OP1 in the non-display area NDA may be completed, without a separate additional process, by the process of forming the first contact hole CNT1 and the second contact hole CNT2 (S05) and a process of forming the third contact hole CNT3 and the fourth contact hole CNT4 to be described in more detail below (S06). A portion (as shown in FIG. 11) of the bending opening OP1 may be formed by the process of forming the first contact hole CNT1 and the second contact hole CNT2 (S05). In one or more embodiments, the bending opening OP1 may be completed (as shown in FIG. 12) by the process of forming the third contact hole CNT3 and the fourth contact hole CNT4 (S06).

For example, the first photoresist pattern PR1 is formed to expose not only a part of the silicon semiconductor layer 111 but also the bending opening OP1 of the bending area BA. When etching is performed using the first photoresist pattern PR1, a portion of the buffer layer 103 of the corresponding area may be exposed by the second interlayer dielectric ILD2, and the second gate insulator GI2, the first interlayer dielectric ILD1, and the first gate insulator GI1 of the bending area are etched together in the process of forming the first contact hole CNT1 and the second contact hole CNT2 (S05). In the process S05, the first contact hole CNT1 and the second contact hole CNT2 are etched to expose a portion of the silicon semiconductor layer 111, and thus, the silicon semiconductor layer 111 may be partially etched or damaged in the etching process. The process S05 may be performed such that only the second interlayer dielectric ILD2, the first interlayer dielectric ILD1, and the first gate insulator GI1 of the bending area BA may be etched in the process S05 in order to minimize or reduce the damage applicable to the silicon semiconductor layer 111. Accordingly, through the process S05, the buffer layer 103 of the non-display area NDA may remain without being removed (or fully etched). The bending opening OP1 exposing the surface of the base substrate 101 may be completed through a process of forming the third contact hole CNT3, the fourth contact hole CNT4, and a trench structure OP1 to be described in more detail below (S06).

Subsequently, referring to FIG. 12, the bending opening OP1 is completed by forming the third contact hole CNT3 and the fourth contact hole CNT4 exposing a portion of the oxide semiconductor layer 132 (S06).

The contact holes CNT3 and CNT4 may be formed using a mask process. The third contact hole CNT3 and the fourth contact hole CNT4 may be concurrently (e.g., simultaneously) formed by the same mask. For example, a second photoresist pattern PR2 exposing a portion of the oxide semiconductor layer 132 is formed on the second interlayer dielectric ILD2 where the first contact hole CNT1 and the second contact hole CNT2 are formed, and the second interlayer dielectric ILD2 is etched using the second photoresist pattern PR2 as an etching mask to form the third contact hole CNT3 and the fourth contact hole CNT4 exposing a portion (e.g., the first source/drain area 132a and the second source/drain area 132b) of the oxide semiconductor layer 132.

In addition, the process of forming the bending opening OP1 in the non-display area NDA may be completed through the process S06. The buffer layer 103 and the barrier layer 102 that are not etched in the process of forming the first contact hole CNT1 and the second contact hole CNT2 (S05) may be etched in the process S06, and thus, the process of forming the bending opening OP1 exposing a portion of the base substrate 101 may be completed.

For example, the buffer layer 103 and the barrier layer 102 may have thicknesses similar to that of the second interlayer dielectric ILD2. In other words, a combined thickness of the buffer layer 103 and the barrier layer 102 may have a thickness similar to that of the second interlayer dielectric ILD2. Therefore, by etching the buffer layer 103 and the barrier layer 102, the method of etching the components may be substantially the same as the method of etching the second interlayer dielectric ILD2, and a separate process may not be desirable. Accordingly, the buffer layer 103 and the barrier layer 102 are etched by the process S06, and thus, the process of forming the bending opening OP1 may be completed.

Figure 13:
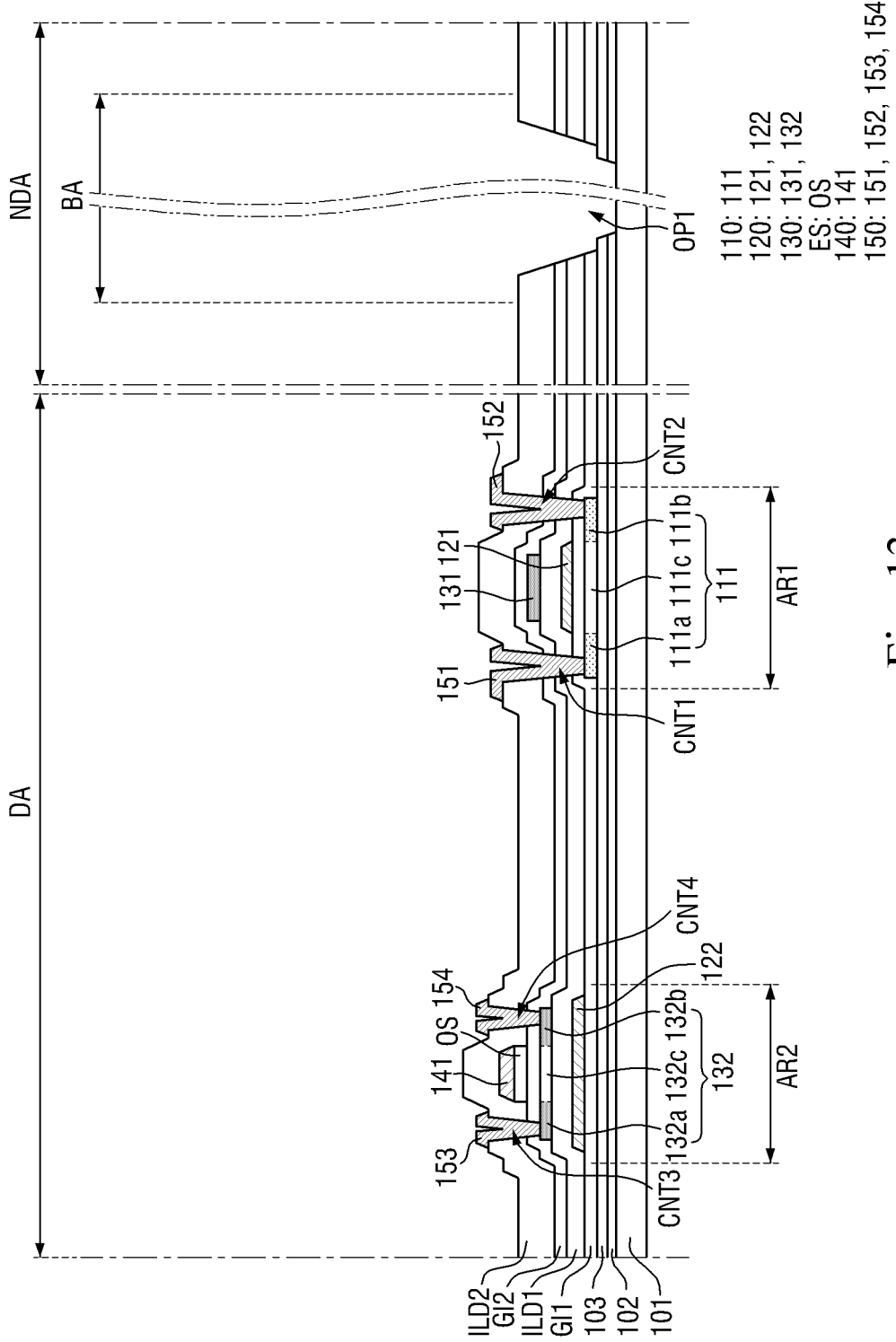

Subsequently, referring to FIG. 13, a third conductive layer 150 is patterned on the second interlayer dielectric ILD2 (S07).

The patterned third conductive layer 150 may be formed by a mask process. For example, a third conductive layer-specific material layer is deposited over the entirety of the second interlayer dielectric ILD2. Through the deposition process, the third conductive layer-specific material layer may be deposited even inside the first to fourth contact holes (e.g., the first contact hole CNT1, the second contact hole CNT2, the third contact hole CNT3, and the fourth contact hole CNT4). Accordingly, first and second source/drain electrodes 151 and 152 of a transistor disposed in the silicon semiconductor region AR1 and first and second source/drain electrodes 153 and 154 of a transistor disposed in the oxide semiconductor region AR2 may be connected to the silicon semiconductor layer 111 and the oxide semiconductor layer 132, respectively. Subsequently, a photoresist pattern is formed by applying a photoresist layer onto the third conductive layer-specific material layer and performing exposure and development, and then the third conductive layer-specific material layer is etched using the photoresist pattern as an etching mask. Subsequently, the photoresist pattern is removed through a stripping and/or ashing process to complete the patterned third conductive layer 150 as shown in FIG. 13.

Figure 14:
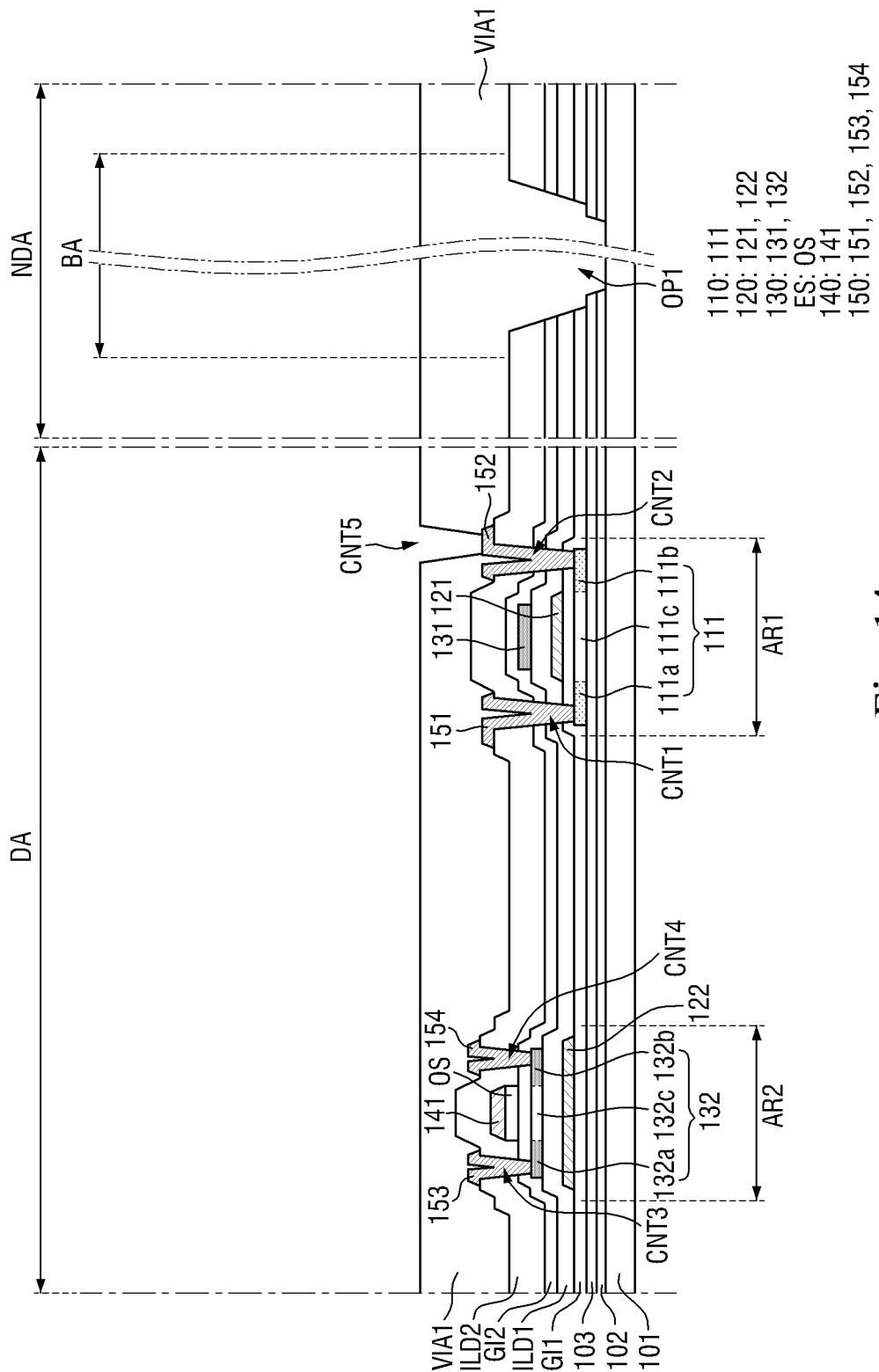

Subsequently, referring to FIG. 14, a first via layer VIA1 is formed on the third conductive layer 150, and a fifth contact hole CNT5 exposing a portion of the first and second source/drain electrodes 151 and 152 of the transistor disposed in the silicon semiconductor region AR1 is formed (S08).

The first via layer VIA1 may contain, for example, an organic material including a photosensitive material. The first via layer VIA1 may be stacked on both of the display area DA and the non-display area NDA and may have a generally or substantially flat surface. In this case, the bending opening OP1 of the bending area BA of the non-display area NDA may be filled with the first via layer VIA1. The first via layer VIA1 may form the fifth contact hole CNT5 exposing a portion of the first and second source/drain electrodes 151 and 152 of the transistor disposed in the silicon semiconductor region AR1 by applying a via layer-specific organic material layer and performing exposure and development.

Figure 15:
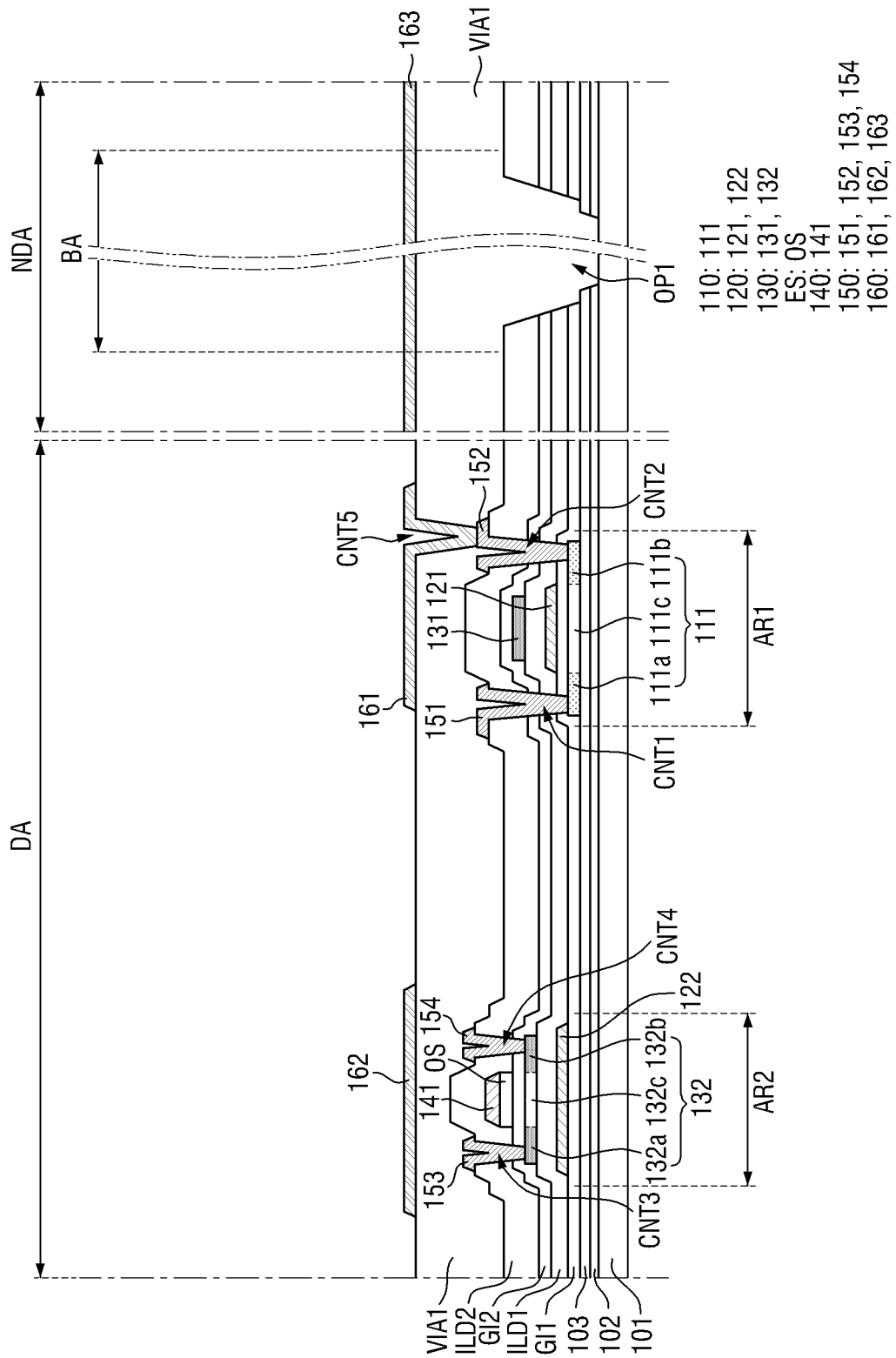

Subsequently, referring to FIG. 15, a fourth conductive layer 160 is formed on the first via layer VIA1 (S09).

Figure 18:
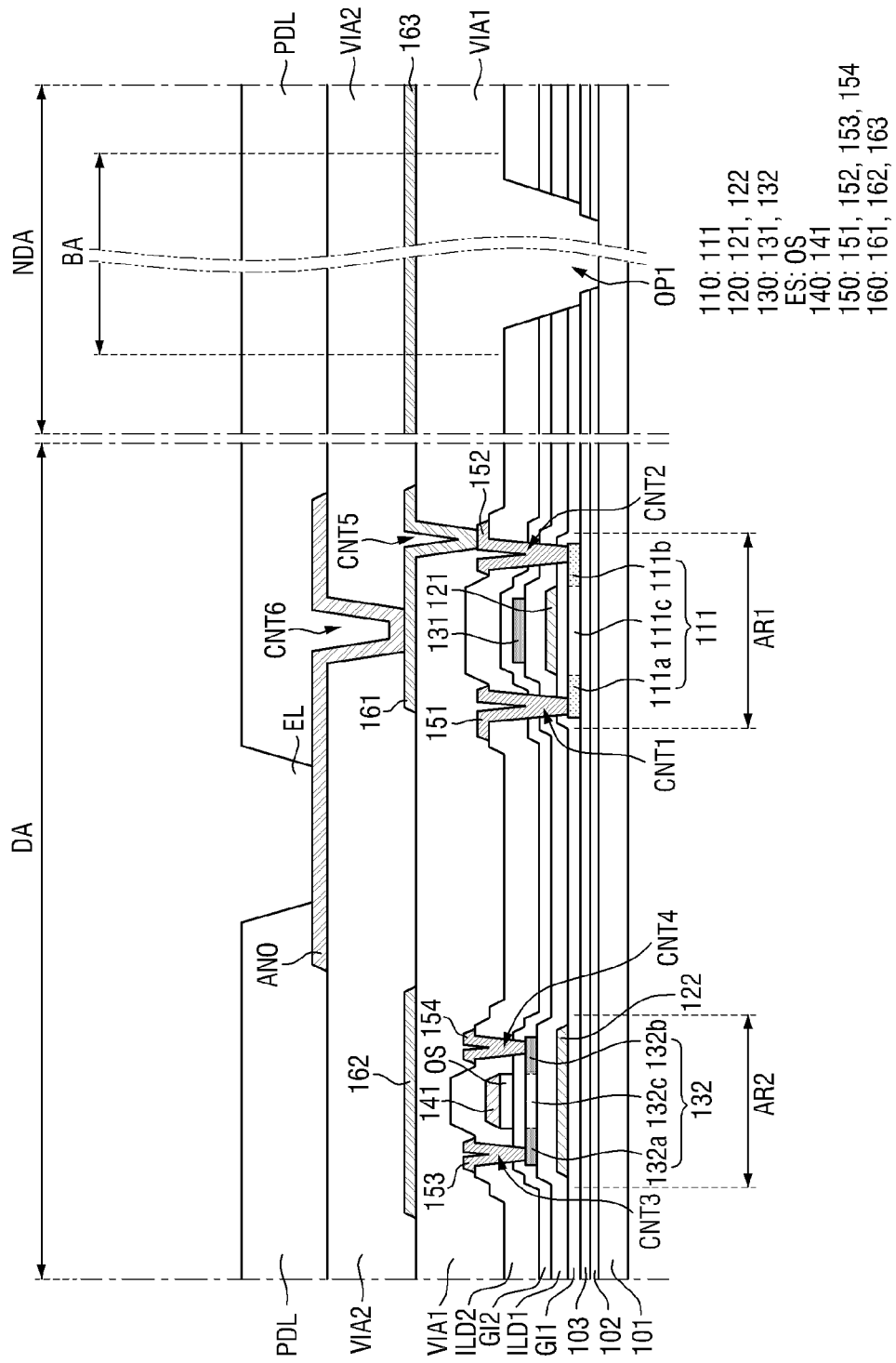

The fourth conductive layer 160 may include a connection electrode 161 disposed in the display area DA, an upper light shielding pattern 162, and a connection wiring 163 disposed in the non-display area NDA. A fourth conductive layer 160 may be patterned by a mask process. For example, a fourth conductive layer-specific material layer is deposited over the entirety of the first via layer VIA1. Through the deposition process, the fourth conductive layer-specific material layer may be deposited even inside the fifth contact hole CNT5. Accordingly, the connection electrode 161 may be connected to the first and second source/drain electrodes 151 and 152 of the transistor disposed in the silicon semiconductor region AR1. Subsequently, a photoresist pattern is formed by applying a photoresist layer onto the fourth conductive layer-specific material layer and performing exposure and development, and then the fourth conductive layer-specific material layer is etched using the formed photoresist pattern as an etching mask. Subsequently, the photoresist pattern is removed through a stripping and/or ashing process to complete the patterned fourth conductive layer 160 as shown in FIG. 18.

Figure 16:
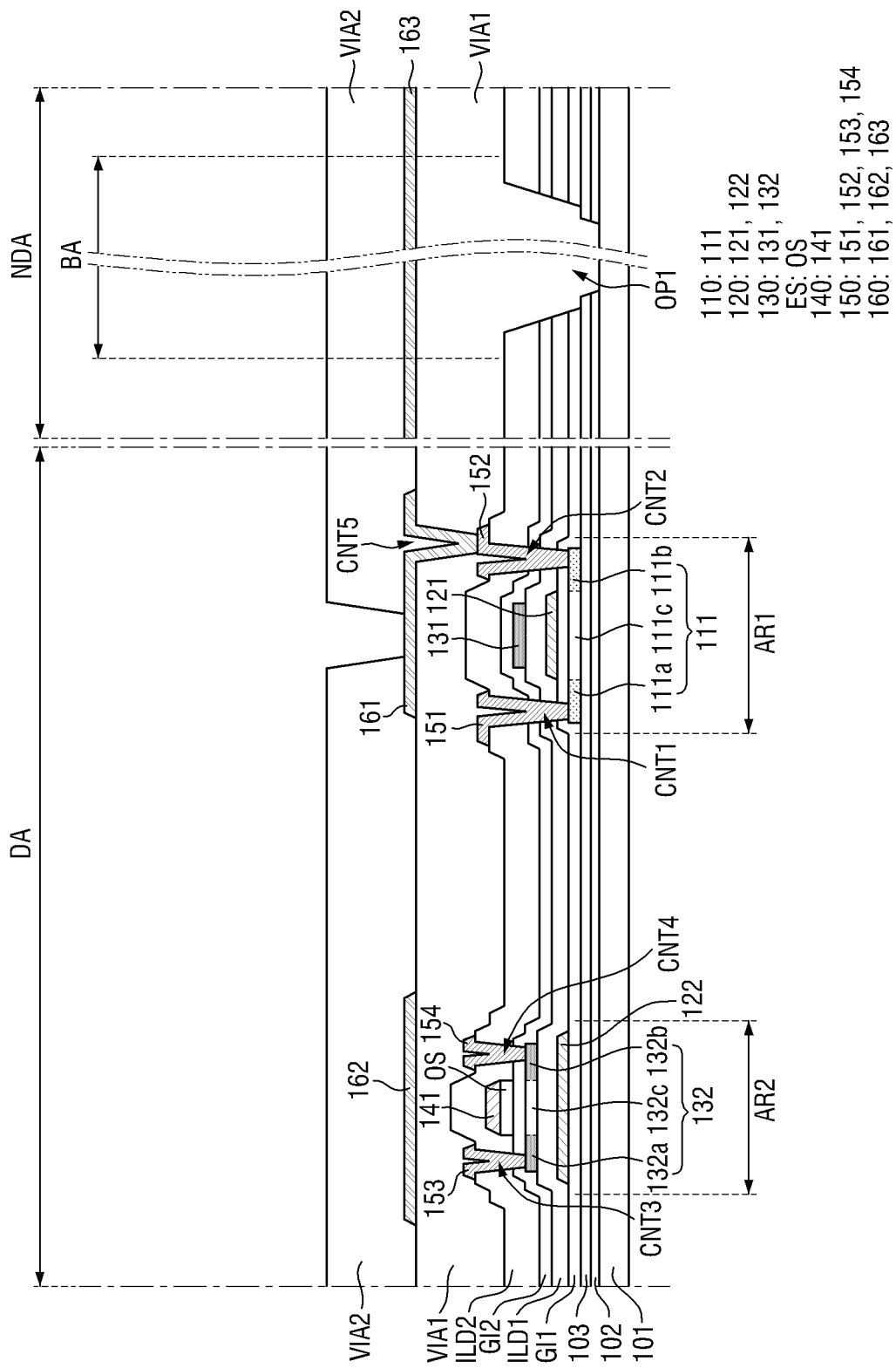

Subsequently, referring to FIG. 16, a second via layer VIA2 is formed on the fourth conductive layer 160, and a sixth contact hole CNT6 (e.g., see FIG. 17) exposing a portion of the connection electrode 161 is formed (S10).

The second via layer VIA2 may contain, for example, an organic material including a photosensitive material. The second via layer VIA2 may be stacked on only the display area DA and may have a generally or substantially flat surface. The second via layer VIA2 may form the sixth contact hole CNT6 exposing a portion of the connection electrode 161 by applying a via layer-specific organic material layer and then performing exposure and development.

Figure 17:
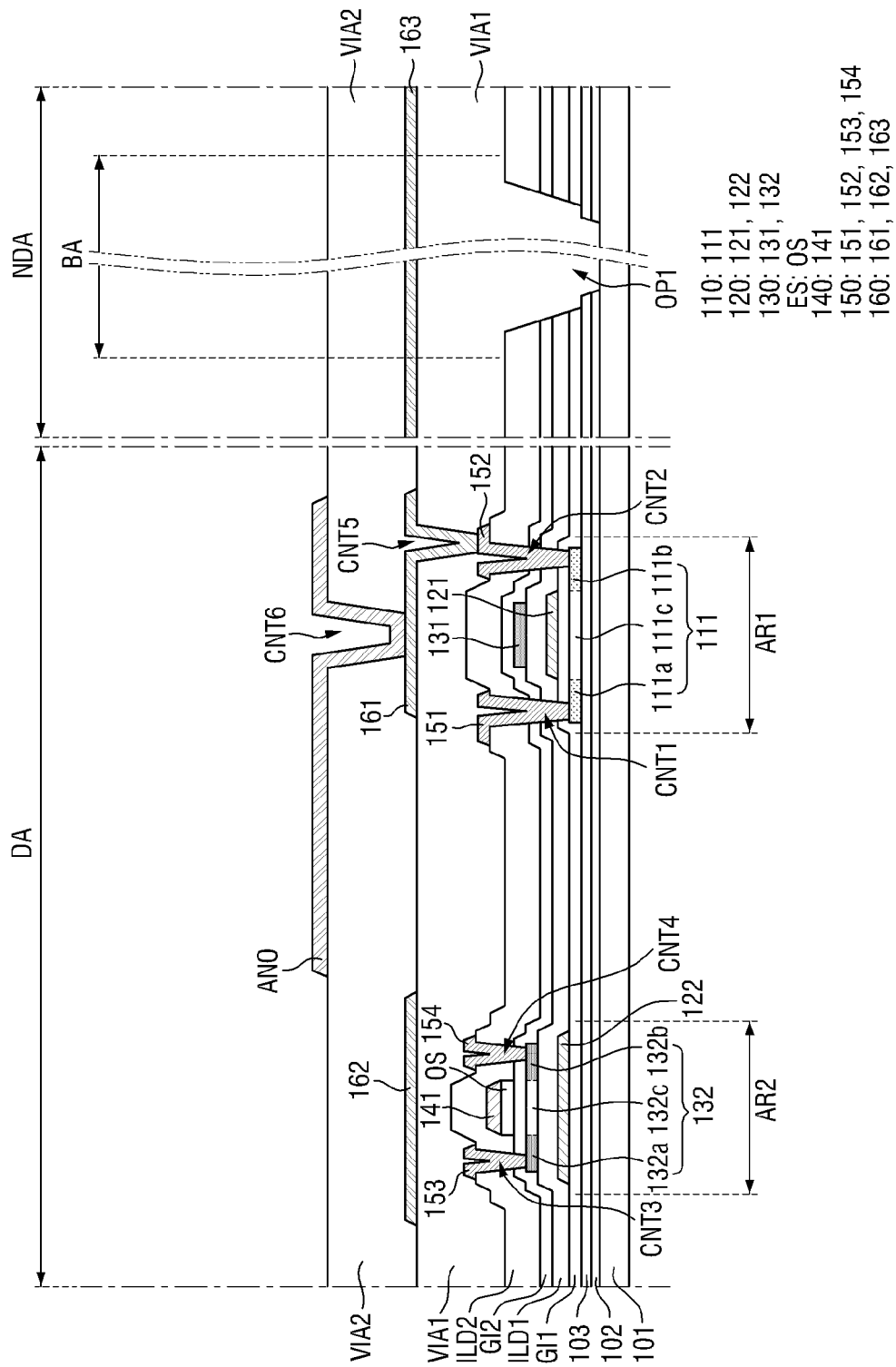

Subsequently, referring to FIG. 17, an anode electrode ANO is formed on the second via layer VIA2 (S11).

The anode electrode ANO may be patterned by a mask process. For example, an anode electrode-specific material layer is deposited over the entirety of the second via layer VIA2. In the deposition process, the anode electrode-specific material layer may be deposited even inside the sixth contact hole CNT6 and connected to the connection electrode 161.

Subsequently, referring to FIG. 18, a patterned pixel defining layer PDL is formed on the second via layer VIA2 on which the anode electrode ANO is formed (S12).

The pixel defining layer PDL may contain, for example, an organic material including a photosensitive material. In this case, the patterned pixel defining layer PDL may be formed by applying a bank layer-specific organic material layer and then performing exposure and development.

The pixel defining layer PDL may be formed along the boundary of a pixel PX and may partially overlap the anode electrode ANO. The pixel defining layer PDL may be formed to overlap the sixth contact hole CNT6. When the anode electrode ANO does not fully, but partially, fill the inner space of the sixth contact hole CNT6, the pixel defining layer PDL may fully fill the inside space of the sixth contact hole CNT6 (e.g., as shown in the embodiment of FIG. 18).

As described above, according to the illustrated embodiment, there is no need for a separate mask process to form one of the two electrodes of the organic capacitor Cst. Therefore, it is possible to reduce the number of masks for the process and thus improve process efficiency.

Other embodiments may be described in more detail below. In the following embodiments, redundant description of the same elements as those described above may be omitted or simplified, and differences may be described.

Figure 19:
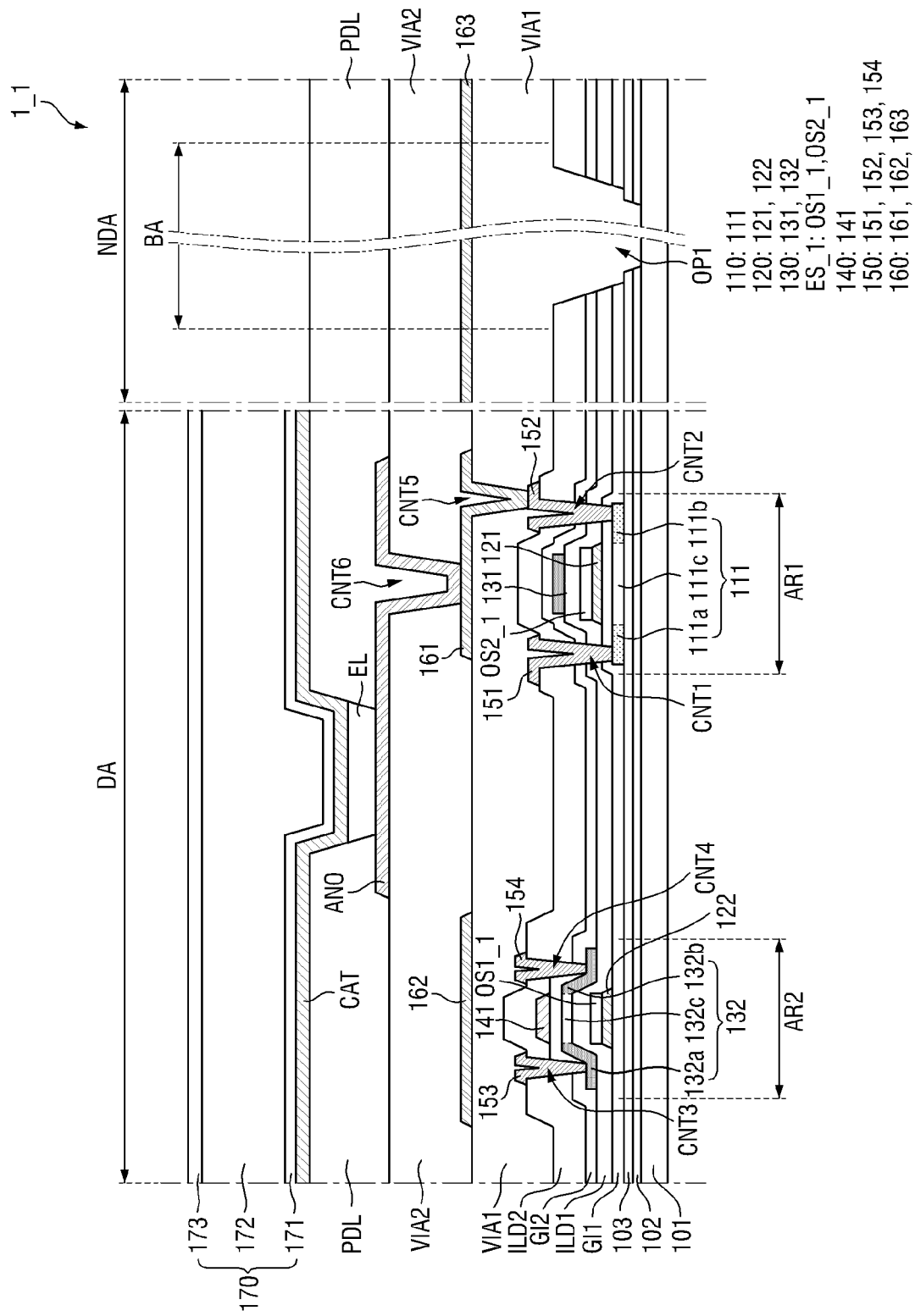
FIG. 19 is a cross-sectional view of a display device according to another embodiment.

FIG. 19 is a cross-sectional view of a display device according to another embodiment.

Referring to FIG. 19, a display device 1_1 according to the illustrated embodiment differs from that of the embodiment of FIG. 4 in that a third semiconductor pattern ES_1 is disposed between the first conductive layer 120 and the second semiconductor pattern 130.

For example, unlike the embodiment of FIG. 4 in which the third semiconductor pattern ES is disposed above the second semiconductor pattern 130 and disposed between the second semiconductor pattern 130 and the second conductive layer 140, the third semiconductor pattern ES_1 according to the illustrated embodiment is disposed below the second semiconductor pattern 130 and disposed between the second semiconductor pattern 130 and the first conductive layer 120. In this case, the third semiconductor pattern ES_1 may be formed using the same mask as that of the first conductive layer 120. Therefore, the third semiconductor pattern ES_1 may be formed in substantially the same pattern as the first conductive layer 120.

The third semiconductor pattern ES_1 may include a first oxygen supply layer OS1_1 and a second oxygen supply layer OS2_1. The first oxygen supply layer OS1_1 is a third semiconductor pattern ES_1 (or a portion thereof) disposed in the region AR2 where oxide transistors are disposed, and the second oxygen supply layer OS2_1 is a third semiconductor pattern ES_1 (or a portion thereof) disposed in the region AR1 where silicon transistors are disposed. The first oxygen supply layer OS1_1 may overlap (e.g., may overlap in the thickness direction) the channel area 132c, the lower gate electrode 122, and/or the second gate electrode 141 of the transistor disposed in the region AR2 where oxide transistors are disposed. The second oxygen supply layer OS2_1 may overlap (e.g., may overlap in the thickness direction) the channel area 111c and/or the first gate electrode 121 of the transistor disposed in the region AR1 where silicon transistors are disposed.

In the illustrated embodiment, because there is no need for a separate mask process to form one of the two electrodes of the organic capacitor Cst, it is possible to reduce number of the mask processes and thus improve process efficiency. Also, the second semiconductor pattern 130 may become conductive even though the second semiconductor pattern 130 is not in direct contact with the second interlayer dielectric ILD2.

Figure 20:
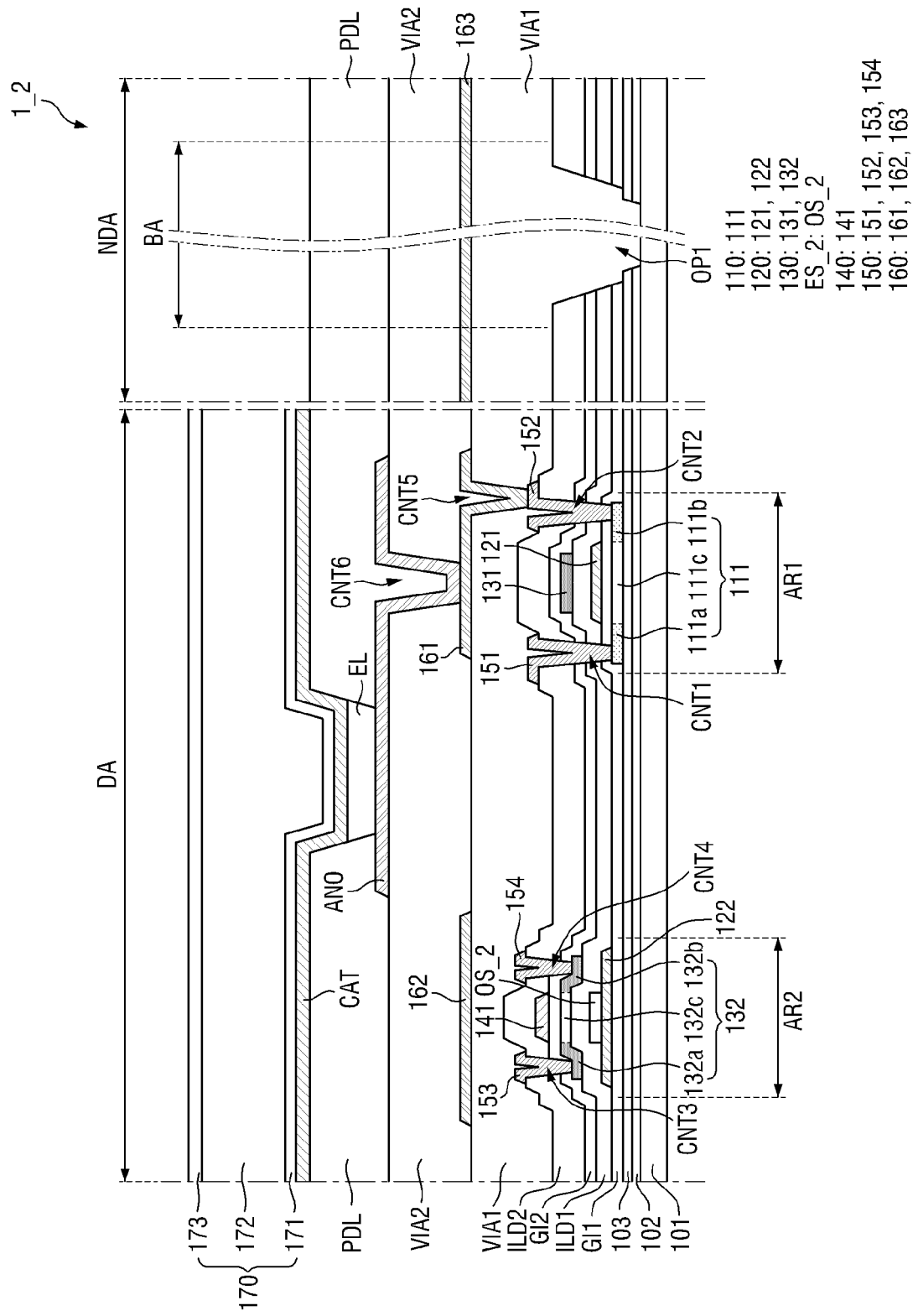
FIG. 20 is a cross-sectional view of a display device according to still another embodiment.

FIG. 20 is a cross-sectional view of a display device according to still another embodiment.

Referring to FIG. 20, a display device 1_2 according to the illustrated embodiment differs from that of the embodiment of FIG. 19 in that a third semiconductor pattern ES_2 is disposed between the first conductive layer 120 and the second semiconductor pattern 130 and formed in a pattern different from that of the first conductive layer 120.

For example, unlike the embodiment of FIG. 19 in which the third semiconductor pattern ES_1 is formed in substantially the same pattern as that of the first conductive layer 120, the third semiconductor pattern ES_2 according to the illustrated embodiment is formed in a pattern different from that of the first conductive layer 120. That is, the third semiconductor pattern ES_2 may be disposed below the second semiconductor pattern 130 (e.g., the oxide semiconductor layer 132 of the second semiconductor pattern 130) and located between the second semiconductor pattern 130 and the first conductive layer 120 (e.g., the lower gate electrode 122 of the first conductive layer 120) but may overlap (e.g., may overlap in the thickness direction) a portion of the first conductive layer 120. The third semiconductor pattern ES_2 may include an oxygen supply layer OS_2, and the oxygen supply layer OS_2 may be disposed in the region AR2 where oxide transistors are disposed but not in the region AR1 where silicon transistors are disposed. The oxygen supply layer OS_2 may overlap the second gate electrode 141 and/or the channel area 132c of the transistor disposed in the region AR2 where oxide transistors are disposed. In addition, the oxygen supply layer OS_2 may overlap a portion of the lower gate electrode 122.

In the illustrated embodiment, because there is no need for a separate mask process to form one of the two electrodes of the organic capacitor Cst, it is possible to reduce the number of mask for the process and thus improve process efficiency. Also, the second semiconductor pattern 130 may become conductive even though the second semiconductor pattern 130 is not in direct contact with the second interlayer dielectric ILD2.

Figure 21:
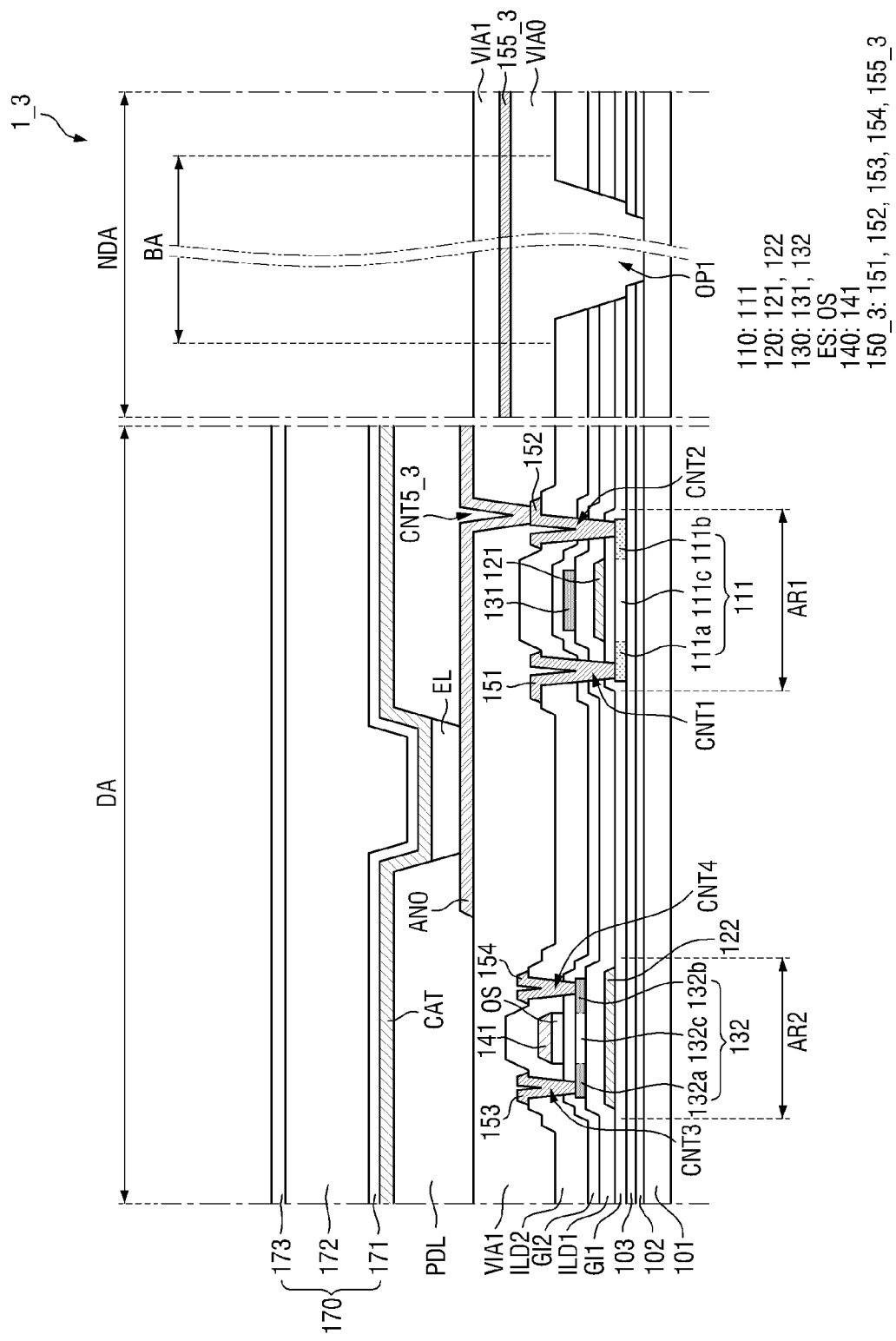
FIG. 21 is a cross-sectional view of a display device according to still another embodiment.

FIG. 21 is a cross-sectional view of a display device according to still another embodiment.

Referring to FIG. 21, a display device 1_3 according to the illustrated embodiment differs from that of the embodiment of FIG. 4 in that the display device 1_3 does not include the second via layer VIA2 and the fourth conductive layer 160 and includes a bending via layer VIA0 in the non-display area NDA.

For example, the bending opening OP1 of the non-display area NDA may be filled with the bending via layer VIA0 instead of the first via layer VIA1. The bending via layer VIA0 is made of an inorganic insulating material or an organic insulating material such as polyacrylate resin, epoxy resin, phenolic resin, polyamide resin, polyimide resin, unsaturated polyester resin, polyphenylene ether resin, polyphenylene sulfide resin, or benzocyclobutene (BCB). The bending via layer VIA0 may be a single film or a multilayer film formed as a stacked film of different materials. The bending via layer VIA0 may be made of the same material as the first via layer VIA1, but the present disclosure is not limited thereto.

A non-display area wiring 155_3 may be disposed on the bending via layer VIA0. The non-display area wiring 155_3 may be formed as the third conductive layer 150. The non-display area wiring 155_3 may be formed along with first and second source/drain electrodes 151 and 152 of a transistor disposed in the silicon semiconductor region AR1 and first and second source/drain electrodes 153 and 154 of a transistor disposed in the oxide semiconductor region AR2 and may be made of the same material as the components 151, 152, 153, and 154.

A first via layer VIA1 may be disposed on the non-display area wiring 155_3, and the first via layer VIA1 may be formed concurrently (e.g., at the same time) as the first via layer VIA1 of the display area DA and may have substantially the same height as the first via layer VIA1 of the display area DA.

An anode electrode ANO and a pixel defining layer PDL may be formed on the first via layer VIA1 in the display area DA, and the anode electrode ANO may be stacked in a fifth contact hole CNT5_3.

Even in this case, there is no need for a separate conductive layer to form a second electrode of the capacitor Cst and the first gate electrode 121, and there is also no need for a mask to form the separate conductive layer. Therefore, it is possible to reduce the number of masks used for the process. Also, the second semiconductor pattern 130 may become conductive even though the second semiconductor pattern 130 is not in direct contact with the second interlayer dielectric ILD2.

A method of manufacturing the display device according to the embodiment of FIG. 21 may be described in more detail below.

Figure 22:
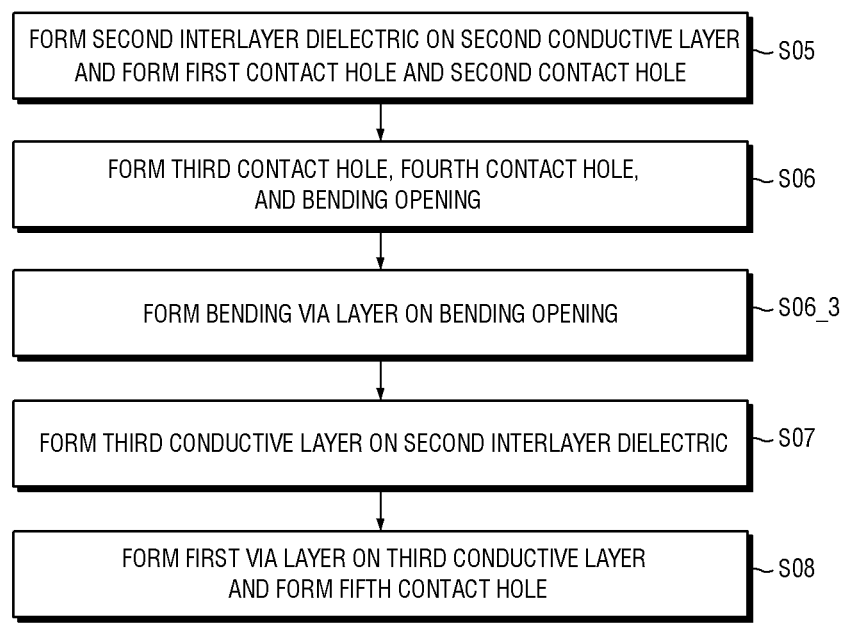
FIG. 22 is a portion of a flowchart illustrating a method of manufacturing the display device corresponding to the embodiment of FIG. 21.
Figure 23:
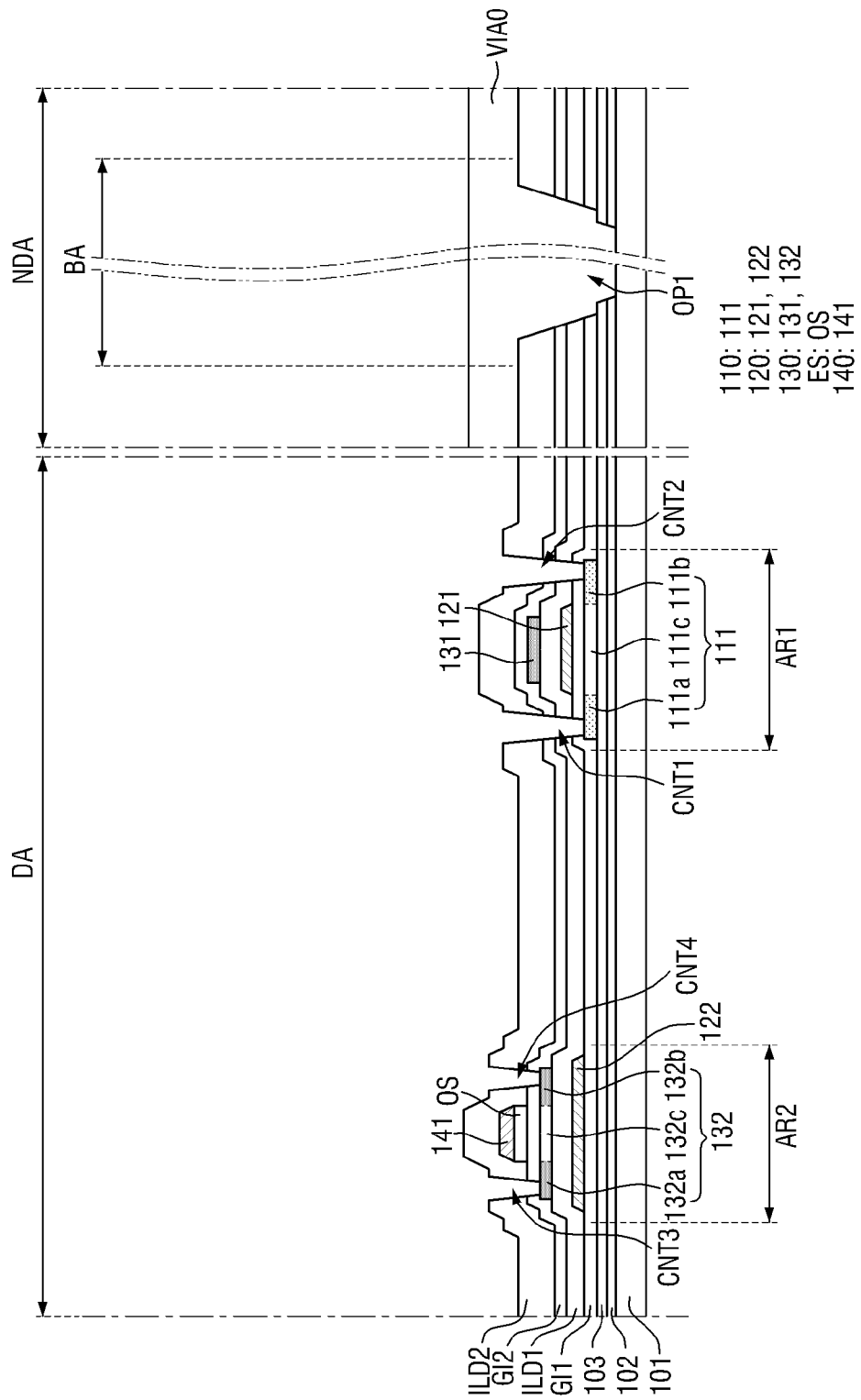
FIGS. 23-25 are cross-sectional views illustrating processing operations of the method of manufacturing the display device corresponding to the embodiment of FIG. 21.
Figure 24:
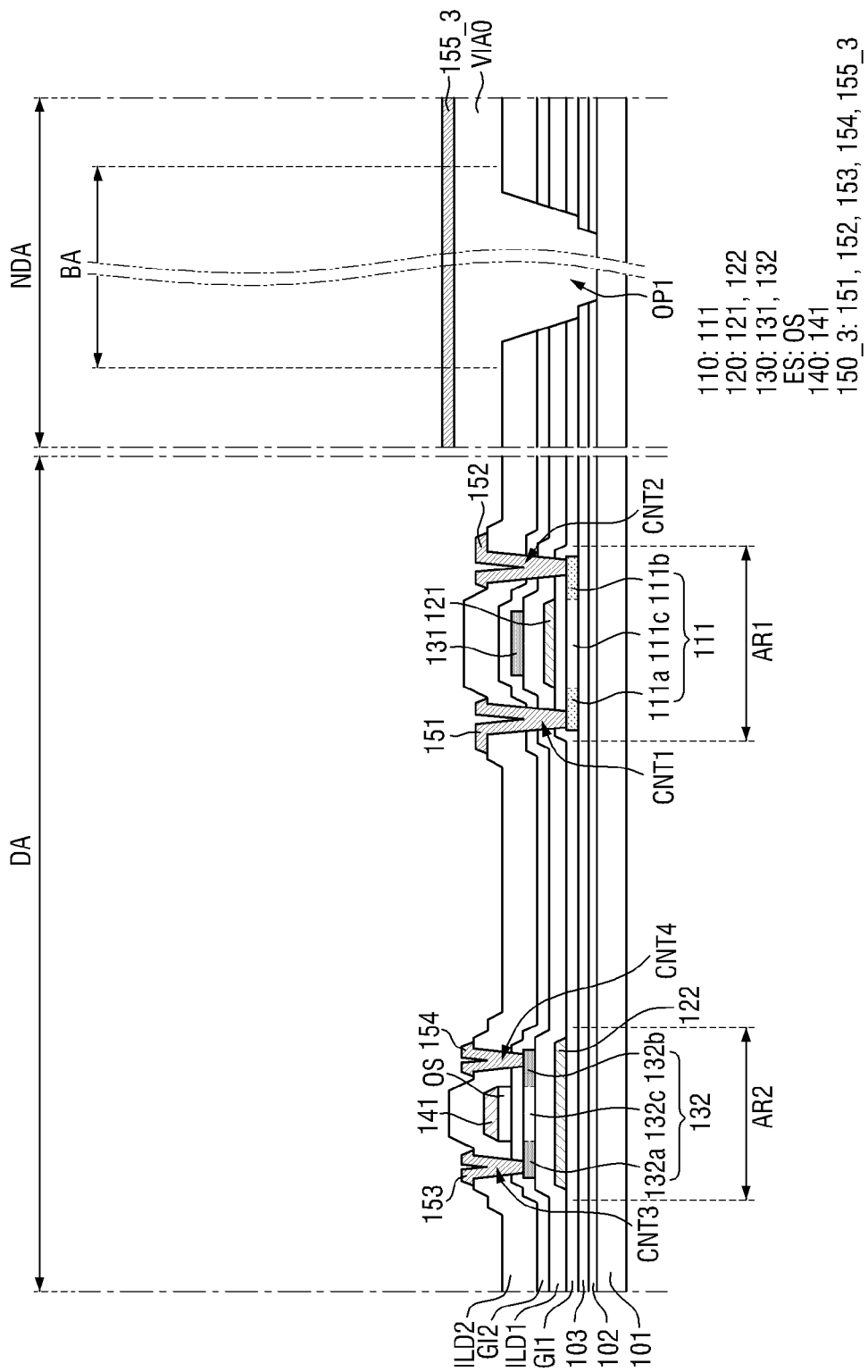
Figure 25:
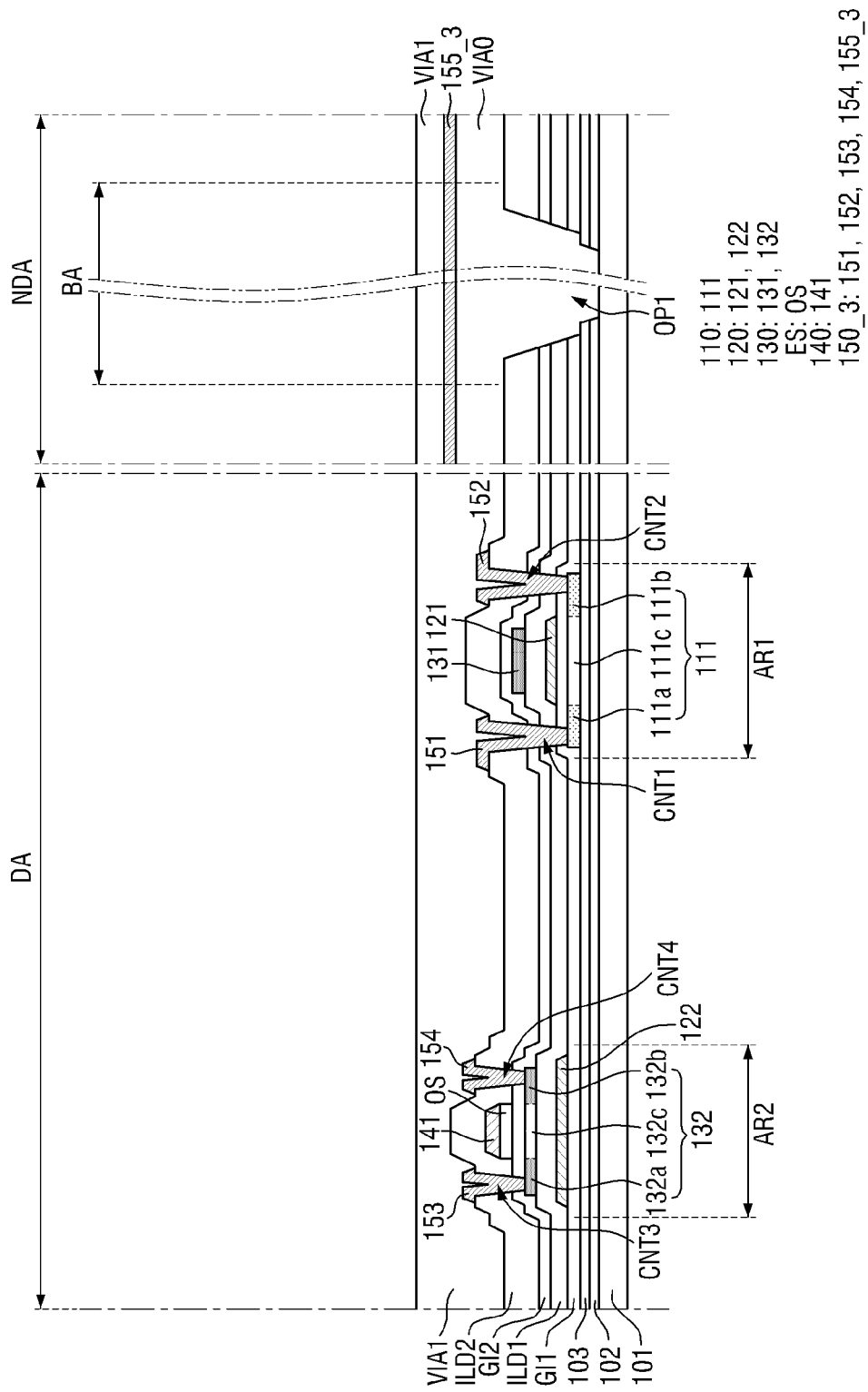

FIG. 22 is a portion of a flowchart illustrating a method of manufacturing the display device corresponding to the embodiment of FIG. 21. FIGS. 23-25 are cross-sectional views illustrating processing operations of the method of manufacturing the display device corresponding to the embodiment of FIG. 21. The processes S01 to S04 and S09 to S12 excluding the processes S05, S06, S06_3, S07, and S08 shown in FIG. 22 may be substantially the same as the embodiment of FIG. 4, and thus a redundant description thereof may be omitted.

Referring to FIGS. 22 and 23, the bending opening OP1 may be formed by the processes of forming the first to fourth contact holes CNT1, CNT2, CNT3, and CNT4 as described above (S05 and S06). After the processes S05 and S06, the bending via layer VIA0 may be formed on the bending opening OP1 (S06_3). The bending via layer VIA0 may fill the bending opening OP1, may be in contact with an upper surface of the base substrate 101 in the bending opening OP1, and may also be in contact with side surfaces of the barrier layer 102, the buffer layer 103, the first gate insulator GI1, the first interlayer dielectric ILD1, and the second interlayer dielectric ILD2 and an upper surface of the second interlayer dielectric ILD2.

Subsequently, referring to FIGS. 24 and 25, the third conductive layer 150 may be formed on the bending via layer VIA0 and the second interlayer dielectric ILD2 (S07). The third conductive layer 150 may include first and second source/drain electrodes 151 and 152 of a transistor disposed in the silicon semiconductor region AR1, first and second source/drain electrodes 153 and 154 of a transistor disposed in the oxide semiconductor region AR2, and a non-display area wiring 155_3 disposed on the bending via layer VIA0.

A first via layer VIA1 may be formed on the third conductive layer 150 (S08). The first via layer VIA1 may have the same height in both of the display area DA and the non-display area NDA.

While the embodiments of the present disclosure have been described with reference to the accompanying drawings, it will be understood by those skilled in the art that various modifications can be made without departing from the scope of the present disclosure and without changing essential features. Therefore, the above-described embodiments should be considered in a descriptive sense only and not for purposes of limitation.

While the present invention has been particularly shown and described with reference to some example embodiments thereof, it will be understood by those of ordinary skill in the art that various changes in form and details may be made therein without departing from the spirit and scope of the present invention as set forth in the following claims and their equivalents.

What is claimed is:

1. A display device including a first transistor and a second transistor having channels of different semiconductor layers, and a capacitor, the display device comprising:
    a substrate;
    a first semiconductor pattern on the substrate and comprising a semiconductor layer of the first transistor;
    a first gate insulator on the substrate to cover the first semiconductor pattern;
    a first conductive layer on the first gate insulator and comprising a first gate electrode of the first transistor and a first electrode of the capacitor connected to the first gate electrode of the first transistor;
    a first interlayer dielectric on the first gate insulator to cover the first conductive layer;
    a second semiconductor pattern on the first interlayer dielectric and comprising a semiconductor layer of the second transistor and a second electrode of the capacitor;
    a second gate insulator on the first interlayer dielectric to cover an upper surface and a side surface of the second semiconductor pattern;
    a second conductive layer on the second gate insulator and comprising a gate electrode of the second transistor; and
    a third semiconductor pattern between the second semiconductor pattern and any one of the first conductive layer and the second conductive layer,
    wherein the second gate insulator is disposed between the second semiconductor pattern and the gate electrode of the second transistor, and contacts a top surface of the second electrode of the capacitor.

2. The display device of claim 1, wherein the first conductive layer further comprises a light-shielding pattern overlapping at least a portion of the semiconductor layer of the second transistor.

3. The display device of claim 2, wherein the light-shielding pattern is electrically connected to the gate electrode of the second transistor or is electrically connected to any one of a first source/drain electrode and a second source/drain electrode of the second transistor.

4. The display device of claim 2, wherein the third semiconductor pattern is between the first conductive layer and the second semiconductor pattern to overlap the light-shielding pattern.

5. The display device of claim 4, wherein the third semiconductor pattern is formed in the same pattern as the first conductive layer.

6. The display device of claim 1, wherein the third semiconductor pattern is between the second semiconductor pattern and the second conductive layer to overlap the gate electrode of the second transistor.

7. The display device of claim 6, wherein the third semiconductor pattern and the second conductive layer are formed in the same pattern.

8. The display device of claim 1, wherein the first transistor is a p-channel metal-oxide semiconductor (PMOS) transistor and comprises polycrystalline silicon, and the second transistor is an n-channel metal-oxide semiconductor (NMOS) transistor and comprises an oxide semiconductor.

9. The display device of claim 8, wherein the third semiconductor pattern comprises the same material as the second semiconductor pattern.

\* \* \* \* \*